United States Patent
Merchant et al.

(10) Patent No.: US 12,009,267 B2
(45) Date of Patent: Jun. 11, 2024

(54) NANOSHEET DEVICE WITH DIFFERENT GATE LENGTHS IN SAME STACK

(71) Applicant: NXP B.V., Eindhoven (NL)

(72) Inventors: Tushar Praful Merchant, Austin, TX (US); Mark Douglas Hall, Austin, TX (US); Anirban Roy, Austin, TX (US)

(73) Assignee: NXP B.V., Eindhoven (NL)

( * ) Notice: Subject to any disclaimer, the term of this patent is extended or adjusted under 35 U.S.C. 154(b) by 12 days.

(21) Appl. No.: 17/203,489

(22) Filed: Mar. 16, 2021

(65) Prior Publication Data
US 2022/0301936 A1    Sep. 22, 2022

(51) Int. Cl.
| | | |
|---|---|---|
| H01L 21/8238 | (2006.01) | |
| H01L 21/02 | (2006.01) | |
| H01L 21/285 | (2006.01) | |
| H01L 21/3065 | (2006.01) | |
| H01L 27/092 | (2006.01) | |
| H01L 29/06 | (2006.01) | |
| H01L 29/423 | (2006.01) | |
| H01L 29/45 | (2006.01) | |

(Continued)

(52) U.S. Cl.
CPC .. H01L 21/82385 (2013.01); H01L 21/02532 (2013.01); H01L 21/02603 (2013.01); H01L 21/28518 (2013.01); H01L 21/3065 (2013.01); H01L 21/823807 (2013.01); H01L 21/823864 (2013.01); H01L 27/0922 (2013.01); H01L 29/0673 (2013.01); H01L 29/42392 (2013.01); H01L 29/45 (2013.01); H01L 29/66553 (2013.01); H01L 29/66742 (2013.01); H01L 29/78618 (2013.01); H01L 29/78696 (2013.01)

(58) Field of Classification Search
CPC ............. H01L 27/0688; H01L 21/8221; H01L 27/0922
See application file for complete search history.

(56) References Cited

U.S. PATENT DOCUMENTS

| | | |
|---|---|---|
| 10,141,403 B1 | 11/2018 | Cheng et al. |
| 10,269,920 B2 | 4/2019 | Cheng et al. |
| 10,283,516 B1 | 5/2019 | Reznicek et al. |

(Continued)

OTHER PUBLICATIONS

A. Hubert et al., A stacked SONOS technology, up to 4 levels and 6nm crystalline nanowires, with gate-all-around or independent gates (φ-Flash), suitable for full 3D integration, IEEE, 2009.
Wikipedia, Accelerometer, downloaded from the Internet Dec. 23, 2020.
Southwest Center for Microsystems Education (SCME), Microcantilever Applications Overview, Primary Knowledge, Participant Guide, Feb. 2017.

(Continued)

*Primary Examiner* — Brian Turner

(57) ABSTRACT

A semiconductor device and fabrication method are described for integrating stacked top and bottom nanosheet transistors by providing a nanosheet transistor stack having bottom and top Si/SiGe superlattice structures (11-14, 17-20) which are separated from one another by a barrier oxide layer (15) and which are separately processed to form first remnant silicon germanium nanosheet layers (12, 14) in the bottom Si/SiGe superlattice structures having a first gate length dimension (DG1) and to form second remnant silicon germanium nanosheet layers (18, 20) in the top Si/SiGe superlattice structures having a second, smaller gate length dimension (DG2) so that the nanosheet transistor stack may then be processed to simultaneously form bottom and top gate electrodes which replace, respectively, the first and second remnant silicon germanium nanosheet layers.

12 Claims, 13 Drawing Sheets

(51) Int. Cl.
 *H01L 29/66* (2006.01)
 *H01L 29/786* (2006.01)

(56) References Cited

U.S. PATENT DOCUMENTS

| | | | |
|---|---|---|---|
| 10,615,288 | B1 | 4/2020 | Kong et al. |
| 10,700,083 | B1 | 6/2020 | Ramkumar et al. |
| 2018/0082902 | A1* | 3/2018 | Balakrishnan ........ H01L 29/401 |
| 2018/0248021 | A1 | 8/2018 | Bi et al. |
| 2019/0016590 | A1* | 1/2019 | Kaelberer ............. B81C 1/0069 |
| 2019/0371887 | A1 | 12/2019 | Frougier et al. |
| 2020/0083382 | A1 | 3/2020 | Xu et al. |
| 2020/0098859 | A1* | 3/2020 | Reboh ................. H01L 27/0886 |
| 2020/0168715 | A1 | 5/2020 | Wu et al. |
| 2020/0294866 | A1* | 9/2020 | Cheng ............... H01L 21/28088 |

OTHER PUBLICATIONS

Emilie Bernard et al., First Internal Spacers' Introduction in Record High ION/IOFF TiN/HfO2 Gate Multichannel MOSFET Satisfying Both High-Performance and Low Standby Power Requirements, IEEE Electron Device Letters, vol. 30, No. 2, Feb. 2009.

Semiconductor Engineering, Gate-All-Around FET (GAA FET), Nov. 12, 2019 https://semiengineering.com/knowledge_centers/integrated-circuit/transistors/3d/gate-all-around-fet/.

Peide Ye et al., The Nanosheet Transistor Is the Next (and Maybe Last) Step in Moore's Law, Nanosheet devices are scheduled for the 3-nanometer node as soon as 2021, IEEE Spectrum, Jul. 30, 2019.

Mark Lapedus, Semiconductor Engineering, What's After FinFETs?, Jul. 24, 2017.

Jaclyn K. Sprenger et al., Electron-enhanced atomic layer deposition of silicon thin films at room temperature, J. Vac. Sci. Technol. A, vol. 36, No. 1, Jan./Feb. 2018.

* cited by examiner

NANOSHEET DEVICE WITH DIFFERENT GATE LENGTHS IN SAME STACK

BACKGROUND OF THE INVENTION

Field of the Invention

The present invention is directed in general to the field of semiconductor devices. In one aspect, the present invention relates to integrated nanosheet field effect transistors (FET) devices and methods of fabricating same in a nanosheet process flow.

Description of the Related Art

As semiconductor device sizes are scaled down, the requirements for device design and fabrication continue to be tightened in order to fit more circuitry on smaller chips. As device sizes shrink, increasingly complex process integrations are used to define semiconductor device features and structures. For example, finFET transistors replaced planar FET transistors as the leading edge transistor architecture for 1 Xnm nodes, but with next-generation technologies, stacked nanosheet transistors are in line to replace finFETs as the leading edge transistor architecture starting at the 3 nm node. However, the existing solutions for fabricating nanosheet transistors are not well suited at a practical level for integrating nanosheet field effect transistor (FET) devices having different structural properties by virtue of the challenges with fabricating leading edge nanosheet transistors without separately processing different nanosheet transistor stacks which are laterally spaced apart from one another on the substrate, thereby increasing the die area and reducing design flexibility. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
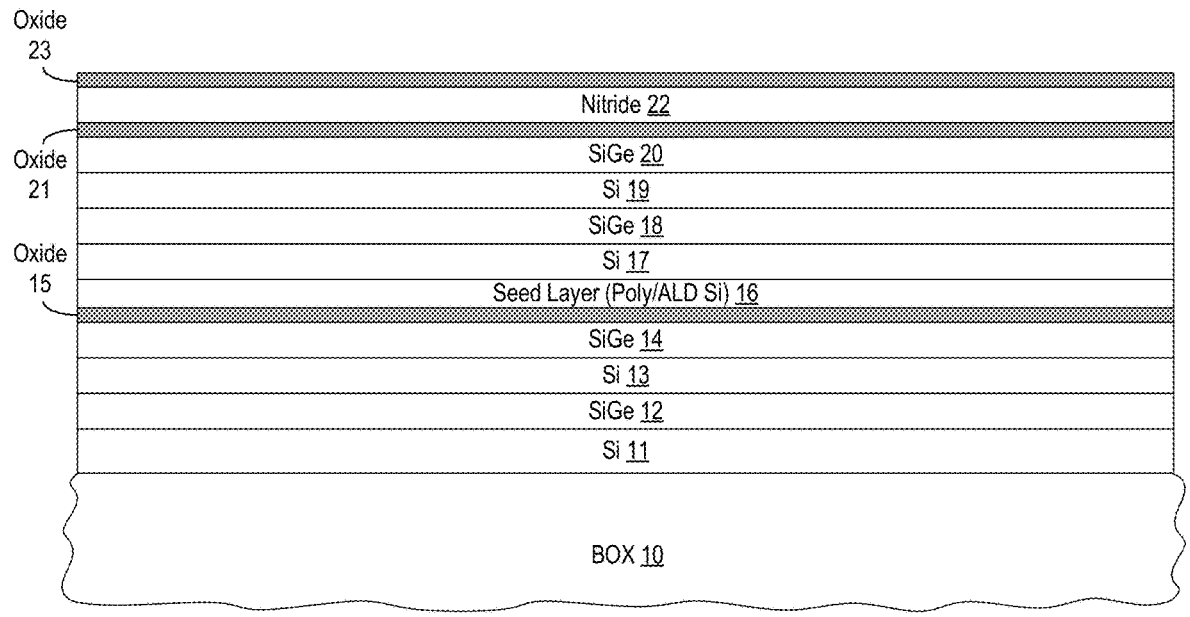
FIG. 1 is a partial cross-sectional view of a semiconductor structure including bottom and top stacked Si/SiGe superlattice structures formed over a substrate, separated from one another by a barrier oxide layer, and covered by protective nitride and oxide layers in accordance with selected embodiments of the present disclosure.

A semiconductor device and fabrication method are described for fabricating stacked nanosheet transistors with different gate lengths in the same stack in a single nanosheet process flow. While specific implementation details are described herein with reference to one or more example embodiments, the present disclosure is directed to an example processing sequence for fabricating nanosheet transistors in the same Si/SiGe stack with different gate lengths using additional process steps that are minimized to reduce complexity and cost. The process steps used for fabricating the stacked nanosheet transistors with different gate lengths are standard process steps, so no new fab tools may be needed. As an initial set of fabrication steps, a wafer substrate is formed with a stack of bottom and top Si/SiGe superlattice structures separated from one another by a barrier oxide layer, and then patterned and etched to form a transistor stack. With a first set of fabrication steps, the transistor stack is processed to partially etch exposed SiGe layers, thereby forming recess openings in the stacked Si/SiGe superlattice structures which define remnant SiGe layers having a first gate length dimension. And after sealing or protecting the bottom Si/SiGe superlattice structures with an organic oxide layer, a second set of fabrication steps is applied to the transistor stack to partially etch exposed SiGe layers from the top Si/SiGe superlattice structures, thereby forming recess openings which define remnant SiGe layers in the top Si/SiGe superlattice structures having a second, smaller gate length dimension. After removing the organic oxide layer, epitaxial source/drain regions are separately formed for each of the stacked bottom and top Si/SiGe superlattice structures. In addition, SiGe layers in the transistor stack are selectively removed with a sequence of SiGe etch steps to form SiGe etch openings. By sequentially filling the SiGe etch openings with atomic layer deposition (ALD) oxide and metal layers, a first set of transistor gate electrodes having the first gate length dimension are formed in the bottom Si/SiGe superlattice structure and a second set of transistor gate electrodes having the second smaller gate length dimension are formed in the top Si/SiGe superlattice structure.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

Various illustrative embodiments of the present invention will now be described in detail with reference to FIGS. 1-25. It is noted that, throughout this detailed description, certain layers of materials will be deposited and removed to form the semiconductor structure. Where the specific procedures for processing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art how to make or use the present invention.

As indicated above, the existing solutions for fabricating nanosheet transistors are not well suited at a practical level for integrating the nanosheet field effect transistor (FET) devices having different gate length dimensions. For example, stacked nanosheet transistors have been proposed to promote higher device density by stacking nanosheet NMOS and PMOS transistors on top of each other in the same Si/SiGe stack, but such stacked arrangements typically form stacked transistors with uniform gate length dimensions. And while nanosheet transistors having different gate lengths have been proposed, instead of being stacked on top of one another, the nanosheet transistors with different gate length dimensions are typically formed by separately processing different nanosheet transistor stacks which are laterally spaced apart from one another on the substrate, thereby increasing the die area and reducing design flexibility. The additional processing steps with such conventional solutions increase the cost, size, and complexity of fabricating integrated circuit devices which include nanosheet transistors.

Turning now to FIG. 1, a partial cross-sectional view illustrates a semiconductor structure 10-23 including a bottom Si/SiGe superlattice structure 11-14 and a top Si/SiGe superlattice structure 17-20 formed over a buried oxide (BOX) substrate layer 10 and separated from one another by a barrier oxide layer 15 and seed layer 16, and covered by protective oxide layer 21, nitride layer 22, and oxide layer 23 in accordance with selected embodiments of the present disclosure. Depending on the requirements for protecting against subsequent processing steps, the protective layers 21-23 may include additional or fewer layers. Though not shown, it will be appreciated that the semiconductor structure 10-23 is formed over an underlying substrate which may be implemented as a bulk silicon substrate, monocrystalline silicon (doped or undoped), or any semiconductor material including, for example, Si, SiC, SiGe, SiGeC, Ge, GaAs, InAs, InP as well as other Group III-V compound semiconductors or any combination thereof, and may be formed as the bulk handling wafer.

As will be appreciated, any suitable sequence of processing steps may be used to form the stacked bottom and top Si/SiGe superlattice structures 11-14, 17-20 on the base structure BOX layer 10. For example, the bottom Si/SiGe superlattice structure 11-14 may be formed by epitaxially growing a plurality of nanosheet semiconductor layers of alternating silicon (Si) 11, 13 and silicon germanium (SiGe) 12, 14. On the last SiGe layer 14, the barrier oxide layer 15 may be formed by depositing an oxide and/or other suitable dielectric layer using chemical vapor deposition (CVD), plasma-enhanced chemical vapor deposition (PECVD), physical vapor deposition (PVD), atomic layer deposition (ALD), thermal oxidation, or any combination(s) of the above to a predetermined thickness that will provide electrical insulation between the bottom and top Si/SiGe superlattice structures 11-14, 17-20. Subsequently, a seed layer 16 may be formed by depositing a layer of polysilicon, ALD silicon, and/or other suitable seed layer using CVD, PECVD, PVD, or any combination(s) of the above to a predetermined thickness that will provide a seed layer for epitaxially growing the subsequently formed silicon layer 17. On the seed layer 16, the top Si/SiGe superlattice structure 17-20 may be formed by epitaxially growing a plurality of nanosheet semiconductor layers of alternating silicon (Si) 17, 19 and silicon germanium (SiGe) 18, 20. As shown, each of the stacked Si/SiGe superlattice structures 11-14, 17-20 is a stack of alternating layers which includes a first group of layers 11, 13, 17, 19 that include silicon and a second group of layers 12, 14, 18, 20 that include silicon germanium. While each stacked Si/SiGe superlattice structure is shown with two silicon nanosheets, it will be appreciated that the number of silicon nanosheets may be decreased or increased (e.g., 4 Si nanosheets instead of 2 Si nanosheets) to optimize transistor performance. In addition, each stacked Si/SiGe superlattice structure may have a different number of nanosheets. If desired, the individual layers of the stacked Si/SiGe superlattice structures 11-14, 17-20 may be doped or implanted with impurities to separately control the conductivity of the stacked Si/SiGe superlattice structures 11-14, 17-20.

The terms "epitaxial growth, "epitaxial deposition" and "epitaxial formation" all refer generally to a semiconductor process for growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

After forming the stacked Si/SiGe superlattice structures 11-14, 17-20, a first insulator or dielectric layer 21 is formed, such as by depositing or otherwise forming a protective oxide layer 21 over the semiconductor substrate using CVD, PECVD, PVD, ALD, thermal oxidation, or any combination (s) of the above to a thickness of approximately 20-200 Angstroms, though a thinner or thicker oxide layer may also be used. In addition, an additional insulator or dielectric layer 22 may be formed on the protective oxide layer 21, such as by depositing or otherwise forming a protective nitride layer 22 to a predetermined thickness. And depending on the subsequent processing requirements, an additional insulator or dielectric layer 23 may be formed on the protective insulator layer 22, such as by depositing or otherwise forming a protective oxide layer 23 to a predetermined thickness. As will be appreciated, the unetched semiconductor structure layers 11-23 are formed to cover the entire top surface of the buried oxide layer 10, including the intended nanosheet transistor areas.

Figure 2:
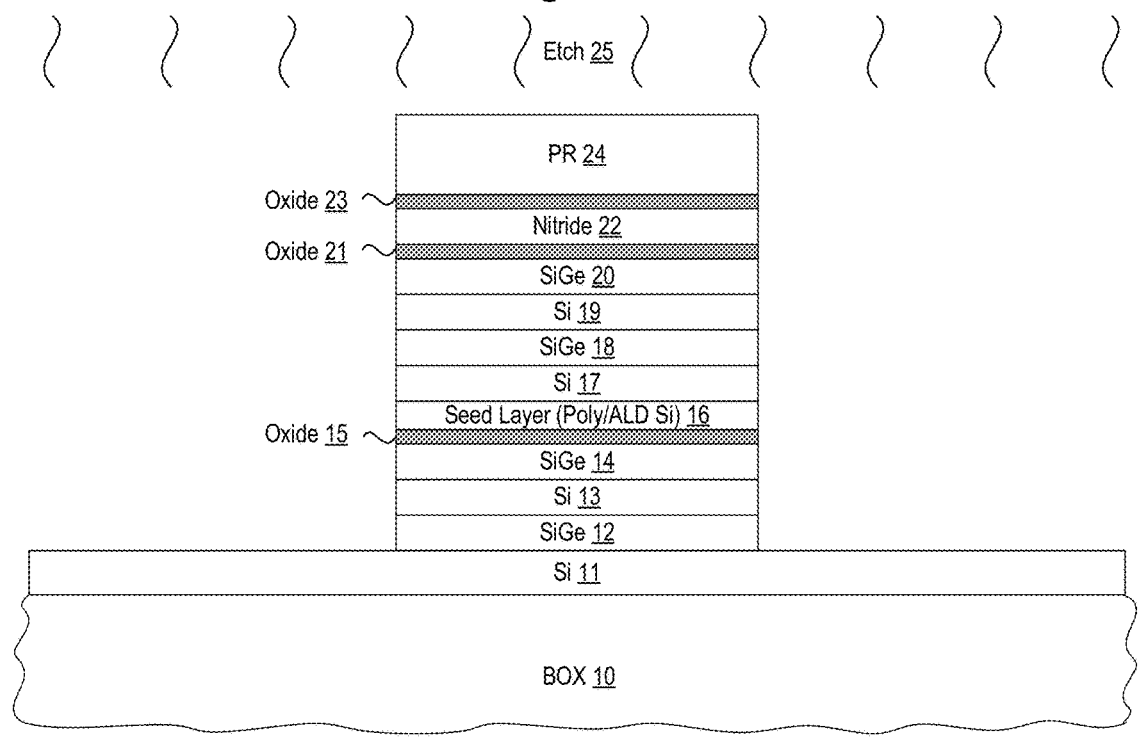
FIG. 2 illustrates processing subsequent to FIG. 1 after the stacked Si/SiGe superlattice structures and barrier oxide layer are patterned and etched to form a transistor stack.

FIG. 2 illustrates processing of the semiconductor structure subsequent to FIG. 1 after the stacked Si/SiGe superlattice structures 11-14, 17-20, barrier oxide layer 15, and seed layer 16 are patterned and etched to form a transistor stack. While any suitable pattern and etch process may be used, a first patterned mask 24 may be formed over the unetched semiconductor structure layers 11-23 by depositing, patterning, etching or developing a photoresist or hard mask layer on the protective oxide layer 23. With the patterned photoresist mask 24 in place, one or more etch processes 25 are applied to create a transistor stack 12-23. The etch processing 25 can include using the patterned photoresist mask 24 to perform a sequence of reactive-ion etching (RIE) steps having suitable etch chemistry properties to remove, in sequence, the exposed portions of the protective oxide layer 23, protective nitride layer 22, protective oxide layer 21, and underlying layers of the top Si/SiGe superlattice structure 17-20, seed layer 16, barrier oxide layer 15, and bottom Si/SiGe superlattice structure 12-14. As will be appreciated, the sidewalls of the transistor stack 12-23 are substantially vertical, though minor deviations in the sidewall profile may occur at each layer due to etch processing variations.

Figure 3:
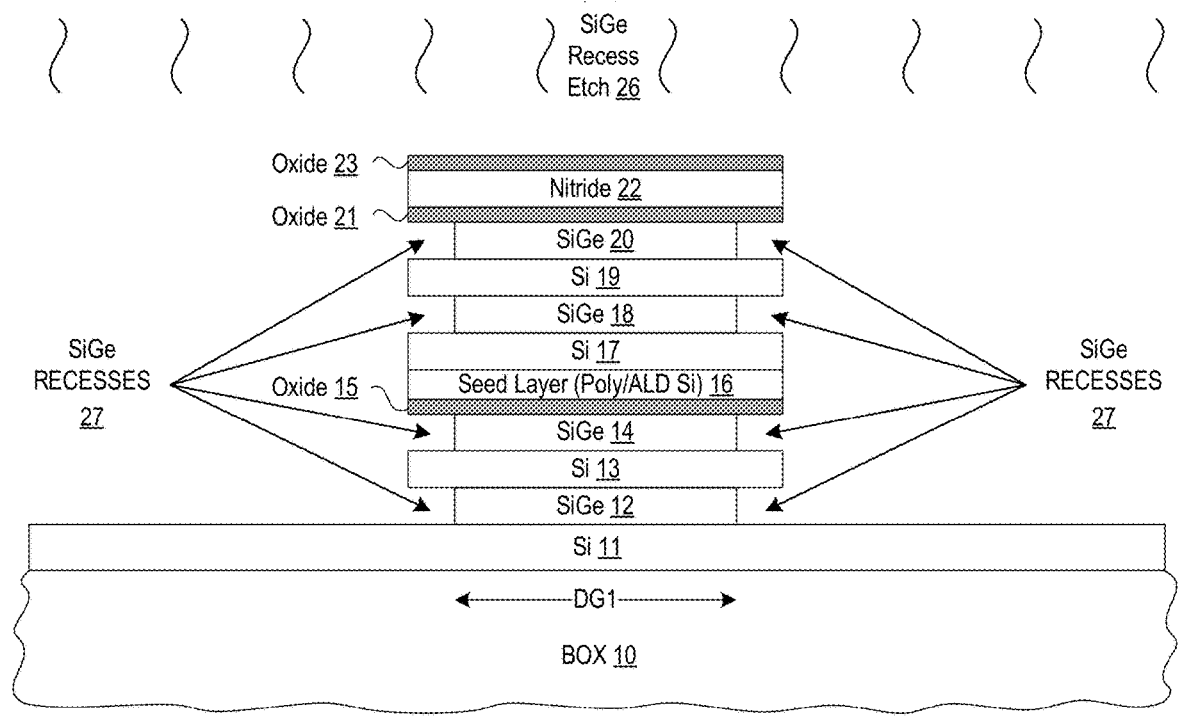
FIG. 3 illustrates processing subsequent to FIG. 2 after partially etching exposed SiGe layers in the transistor stack to form recess openings in the stacked Si/SiGe superlattice structures which define remnant SiGe layers having a first gate length dimension.

FIG. 3 illustrates processing of the semiconductor structure subsequent to FIG. 2 after partially etching exposed SiGe layers in the transistor stack 12-23 to form recess openings 27 in the stacked Si/SiGe superlattice structures which define remnant SiGe layers 12, 14, 18, 20 having a first gate length dimension DG1. At the depicted processing stage, the patterned mask 24 has been removed using any suitable stripping process and a selective SiGe recess etch 26 is applied to selectively and isotropically recess the SiGe layers on the exposed sides of the transistor stack 12-23. While any suitable SiGe etch process may be used, a controlled SiGe recess etch process 26, such as a timed isotropic dry etch, may be used to remove a portion of each SiGe layer from the exposed sides of the transistor stack 12-23. At the conclusion of the etching process, the remnant SiGe portions 12, 14, 18, 20 of the transistor stack remain where the recess openings 27 have not been formed, and will define a first gate length dimension DG1 for the subsequently formed bottom nanosheet transistor. As will be appreciated, the etched sidewall edges of the remnant SiGe portions 12, 14, 18, 20 may have a substantially vertical or slightly curved profile resulting from the selective SiGe recess etch 26.

Figure 4:
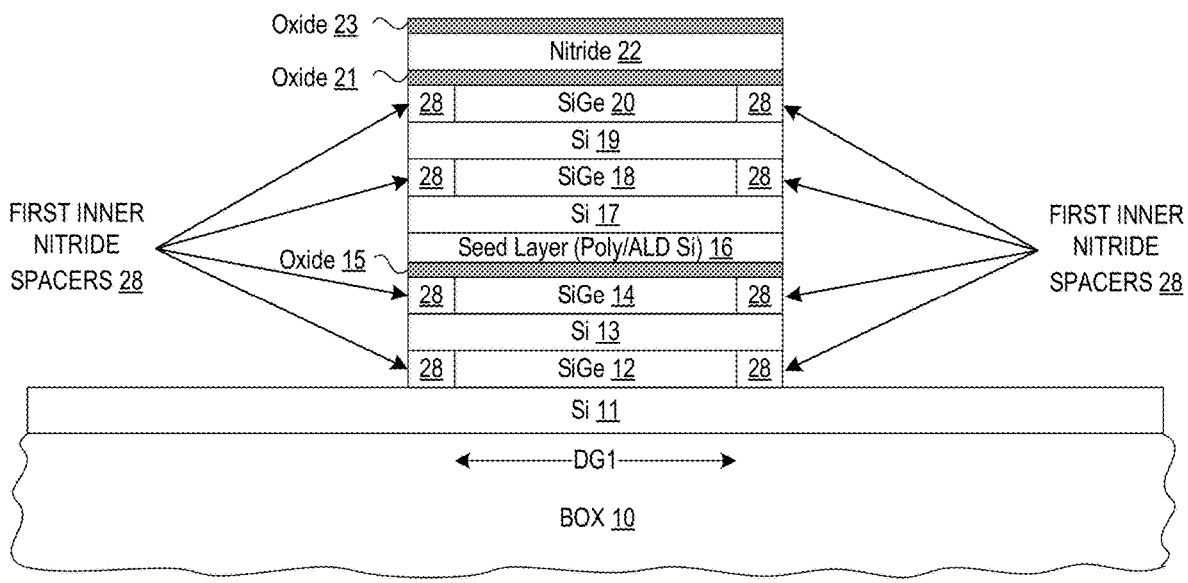
FIG. 4 illustrates processing subsequent to FIG. 3 after forming first inner nitride spacers to fill the recess openings on the exposed sides of the stacked Si/SiGe superlattice structures.

FIG. 4 illustrates processing of the semiconductor structure subsequent to FIG. 3 after forming first inner dielectric spacers 28 to fill recess openings 27 on the exposed sides of the stacked Si/SiGe superlattice structures 11-14, 17-20. While any suitable spacer formation sequence may be used, the first inner dielectric spacers 28 may be formed by depositing one or more nitride layers or other suitable dielectric layers over the semiconductor structure (not shown) that are subsequently etched to remove the nitride/dielectric layer(s) from the top and sides of the transistor stack 11-23 but leaving remnant dielectric spacers 28 in the recess openings 27 at the exposed sides of the transistor stack 11-23. For example, an inner nitride layer may be deposited over the semiconductor structure to a predetermined thickness that is sufficient to cover at least the transistor stack 11-23 and fill the recess openings 27 on the exposed sides thereof. By applying an isotropic nitride etch process (e.g., RIE) to remove the inner nitride layer from the top and sides of the transistor stack 11-23, the remnant inner nitride layers form sidewall spacers 28 on the transistor stack. As will be appreciated, the etched sidewall edges of the remnant nitride spacers 28 may have a substantially vertical or slightly curved profile resulting from the applied isotropic nitride etch process.

Figure 5:
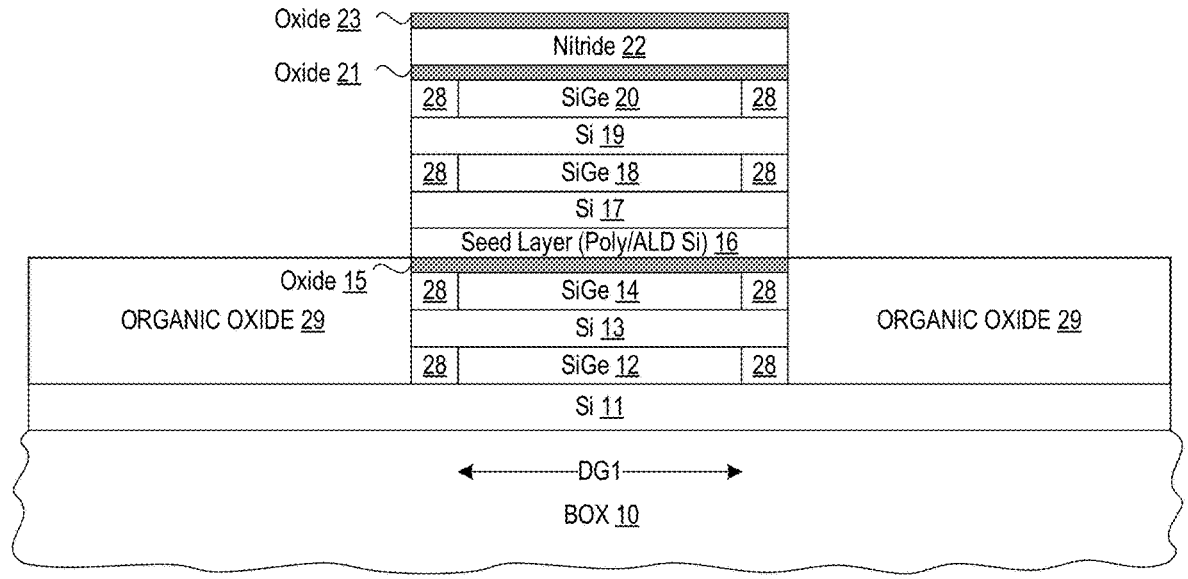
FIG. 5 illustrates processing subsequent to FIG. 4 after forming a first organic oxide layer over the substrate to protect the bottom stacked Si/SiGe superlattice structure from subsequent processing.

FIG. 5 illustrates processing of the semiconductor structure subsequent to FIG. 4 after forming a first organic oxide layer 29 or other suitable protective structure over the substrate to protect the bottom stacked Si/SiGe superlattice structure 11-14 from subsequent processing. For example, the first organic oxide layer 29 may be formed with an organic oxide deposition process where the oxide layer 29 flows to cover the bottom Si/SiGe superlattice structure 11-14 by filling up to the oxide barrier layer 15. In other embodiments, oxide sidewall spacers could be formed to protect the bottom Si/SiGe superlattice structure 11-14 by depositing and anisotropically etching an oxide layer (not shown). As formed, the organic oxide layer 29 or oxide sidewall spacers (not shown) will protect the bottom Si/SiGe superlattice structure 11-14 while the top Si/SiGe superlattice structure 17-20 is subsequently processed.

Figure 6:
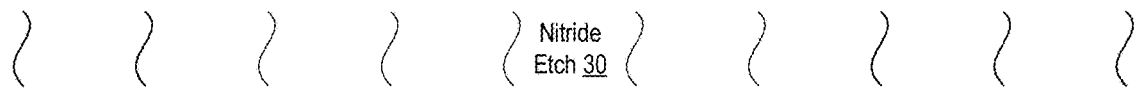
FIG. 6 illustrates processing subsequent to FIG. 5 after selectively etching exposed first inner nitride spacers to form recess openings on exposed sides of the top stacked Si/SiGe superlattice structure.
Figure 6:
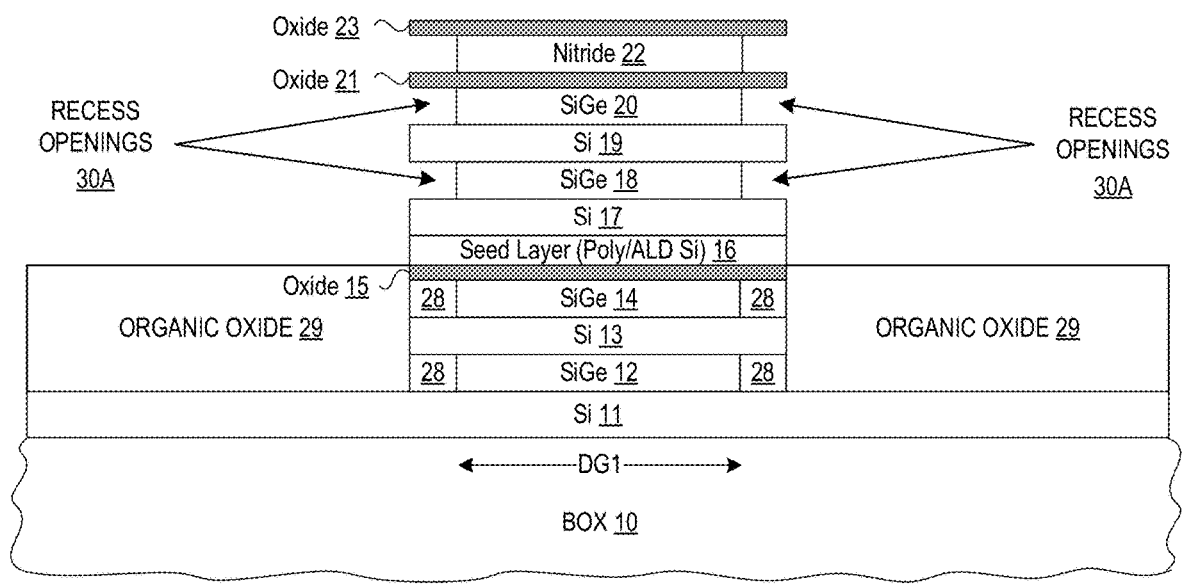

FIG. 6 illustrates processing of the semiconductor structure subsequent to FIG. 5 after a selective etch process 30 is applied to remove exposed first inner nitride spacers 28 from the top Si/SiGe superlattice structure 17-20, thereby forming recess openings 30A. While any suitable selective etch process 30 may be applied, the first inner nitride spacers 28 may be removed by applying a nitride etch process 30 to isotropically etch the exposed first inner nitride spacers 28 (and protective nitride layer 22) from the top Si/SiGe superlattice structure 17-20 while the bottom Si/SiGe superlattice structure 11-14 is protected by the first organic oxide layer 29. At the conclusion of the nitride etch process 30, the remnant SiGe portions 18, 20 of the top Si/SiGe superlattice structure 17-20 are exposed for additional etching. In addition, the etched sidewall edges of the remnant protective nitride layer 22 may have a substantially vertical or slightly curved profile resulting from the nitride etch 30.

Figure 7:
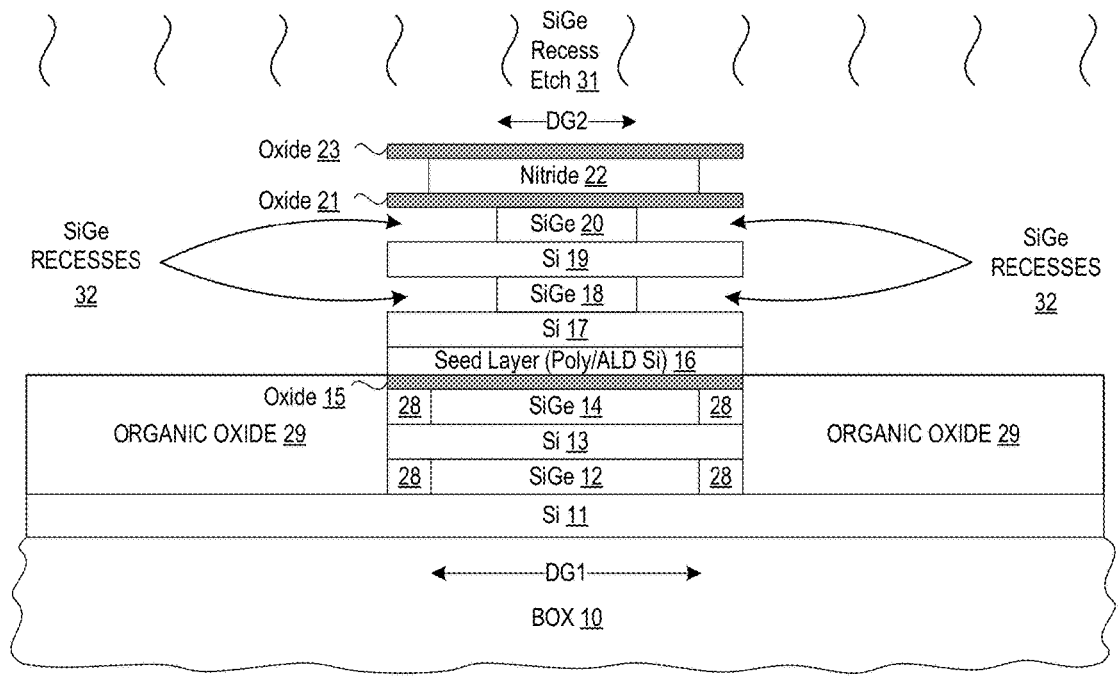
FIG. 7 illustrates processing subsequent to FIG. 6 after partially etching exposed SiGe layers in the transistor stack to form recess openings in the top stacked Si/SiGe superlattice structure which define remnant SiGe layers having a second, smaller gate length dimension.

FIG. 7 illustrates processing of the semiconductor structure subsequent to FIG. 6 after partially etching exposed SiGe layers in the transistor stack to form SiGe recess openings 32 in the top stacked Si/SiGe superlattice structure 17-20 which define remnant SiGe layers 18, 20 having a second, smaller gate length dimension DG2. At the depicted processing stage, the bottom Si/SiGe superlattice structure 11-14 is protected from the SiGe recess etch 31 by the first organic oxide layer 29. In addition, any suitable selective SiGe recess etch 31 may be applied to selectively and isotropically recess the SiGe layers on the exposed sides of the top stacked Si/SiGe superlattice structure 17-20. For example, a controlled SiGe recess etch process 31, such as a timed isotropic dry etch, may be used to remove a portion of each SiGe layer 18, 20. At the conclusion of the etching process, the remnant SiGe portions 18, 20 of the transistor stack remain where the SiGe recess openings 32 have not been formed, and will define a second, smaller gate length dimension DG2 for the subsequently formed top nanosheet transistor. As will be appreciated, the etched sidewall edges of the remnant SiGe portions 18, 20 may have a substantially vertical or slightly curved profile resulting from the selective SiGe recess etch 31.

Figure 8:
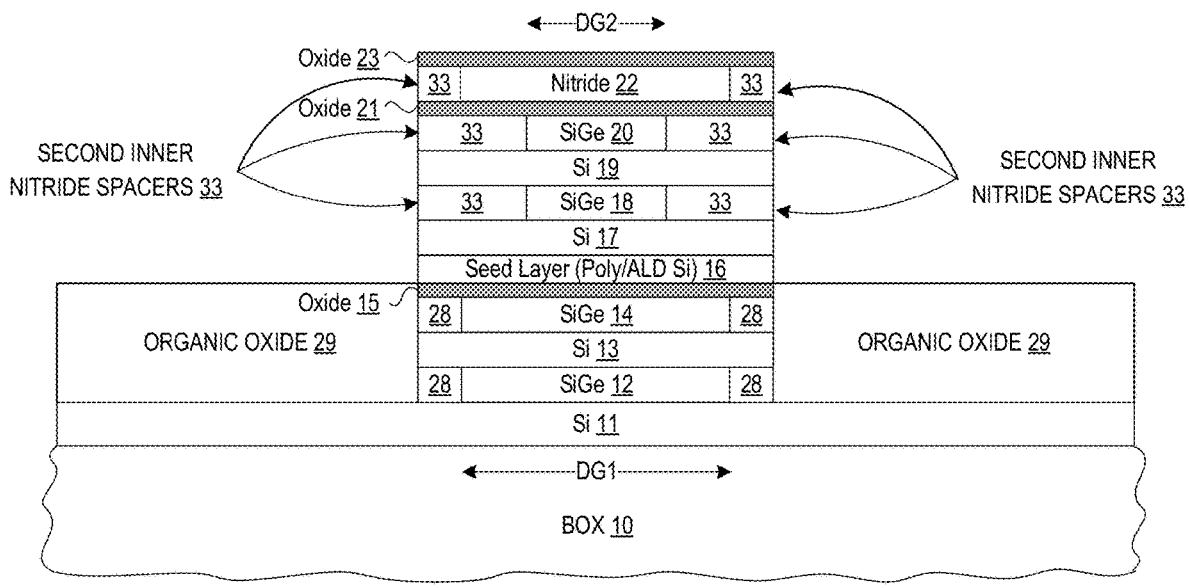
FIG. 8 illustrates processing subsequent to FIG. 7 after forming second inner nitride spacers to fill the recess openings on the exposed sides of the top stacked Si/SiGe superlattice structure.

FIG. 8 illustrates processing of the semiconductor structure subsequent to FIG. 7 after forming second inner dielectric spacers 33 to fill SiGe recess openings 32 on the exposed sides of the top Si/SiGe superlattice structure 17-20. While any suitable spacer formation sequence may be used, the second inner dielectric spacers 33 may be formed by depositing one or more nitride layers or other suitable dielectric layers over the semiconductor structure (not shown) that are subsequently etched to remove the nitride/dielectric layer(s) from the top and sides of the transistor stack but leaving remnant dielectric spacers 33 in the SiGe recess openings 32 at the exposed sides of the top Si/SiGe superlattice structure 17-20. For example, an inner nitride layer may be deposited over the semiconductor structure to a predetermined thickness that is sufficient to cover at least the transistor stack and fill the SiGe recess openings 32 on the exposed sides thereof. By applying an anisotropic nitride etch process (e.g., RIE) to remove the inner nitride layer from the top and sides of the transistor stack, the remnant inner nitride layers form sidewall spacers 33 on the transistor stack. As will be appreciated, the etched sidewall edges of the remnant nitride spacers 33 may have a substantially vertical or slightly curved profile resulting from the applied isotropic nitride etch process.

Figure 9:
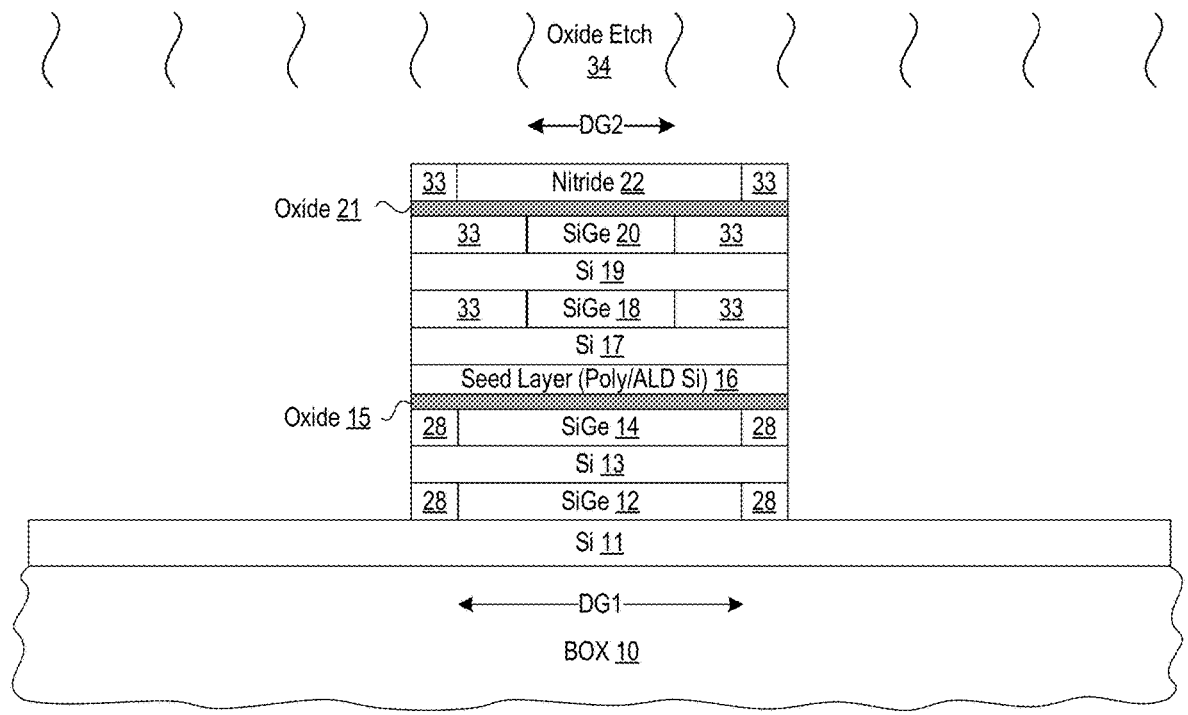
FIG. 9 illustrates processing subsequent to FIG. 8 after selectively removing the first organic oxide layer from the transistor stack.

FIG. 9 illustrates processing of the semiconductor structure subsequent to FIG. 8 after an oxide etch process 34 is applied to selectively remove the first organic oxide layer 29 from the transistor stack. While any suitable etch process 34 may be used, the etch processing can include one or more isotropic etch steps (e.g., a wet etch process) having suitable etch chemistry properties to remove the first organic oxide layer 29 from protecting the bottom Si/SiGe superlattice structure 11-14. By using an anisotropic oxide etch process, the top protective oxide layer 23 will be removed, and the sidewalls of the protective oxide layer 21 and oxide barrier layer 15 will be substantially vertical, though minor deviations in the sidewall profile may occur due to etch processing variations.

Figure 10:
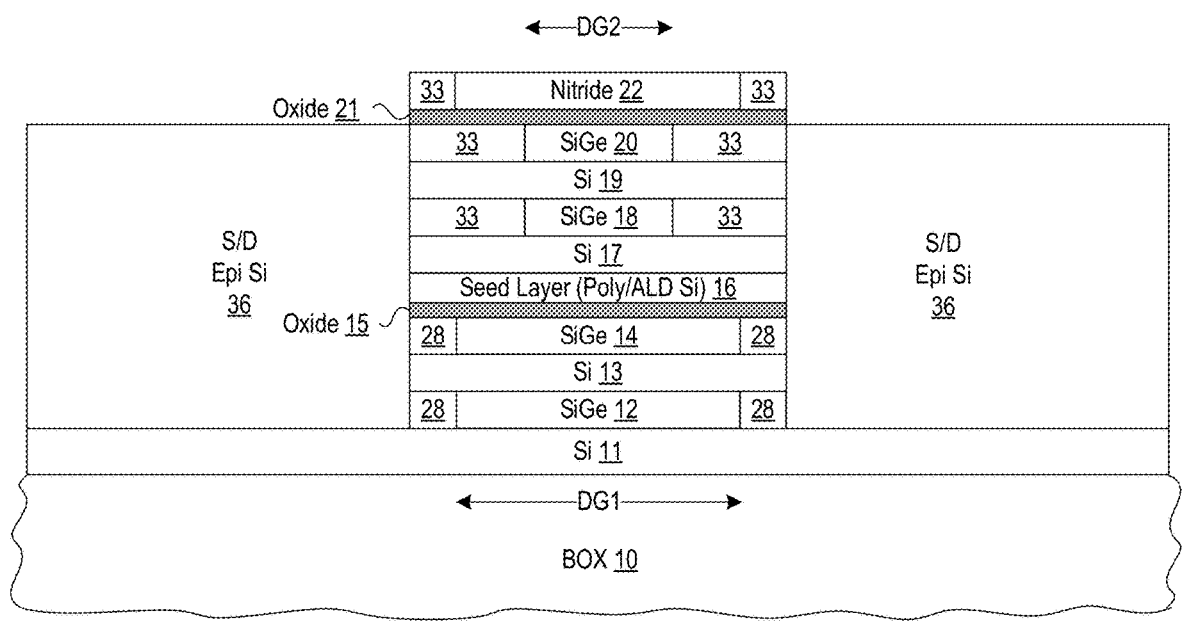
FIG. 10 illustrates processing subsequent to FIG. 9 after forming epitaxial source/drain regions adjacent to the transistor stack which are epitaxially grown to surround the stacked Si/SiGe superlattice structures.

FIG. 10 illustrates processing of the semiconductor structure subsequent to FIG. 9 after forming epitaxial source/drain regions 36 adjacent to the transistor stack which are epitaxially grown to surround the stacked Si/SiGe superlattice structures 12-20, 28, 33. As will be appreciated, the epitaxial silicon deposition or growth process forms the epitaxial source/drain regions 36 from the bottom semiconductor layer 11 and any exposed silicon layers 13, 16-17 and 19. At this point, the epitaxial source/drain regions 36 can be doped using any suitable doping technique. For example, the epitaxial source/drain regions 36 may be in-situ doped during the epi process, such as by doping epitaxially grown source/drain features with boron, arsenic and/or phosphorus to form doped epitaxial source/drain regions 36. In some embodiments, the source/drain features are not in-situ doped, and instead an implantation process is performed to dope the epitaxial source/drain regions 36. As will be appreciated, the doping dose used to dope the epitaxial source/drain regions 36 is greater than a doping dose (if any) used to dope the channel regions in the silicon layers 11, 13, 17, 19. In addition, the formation of the source/drain regions 36 may be performed with doping that is appropriate for the bottom Si/SiGe superlattice structure 11-14 to have N-type or P-type source/drain features. In some embodiments, after formation of the source/drain regions 36, an epi anneal process may be performed to promote formation of crystalline structures in the epitaxial source/drain regions 36, such as by applying a high thermal budget process. In addition, one or more etch or polish steps may be applied to planarize the top surface of the epitaxial source/drain regions 36.

Figure 11:
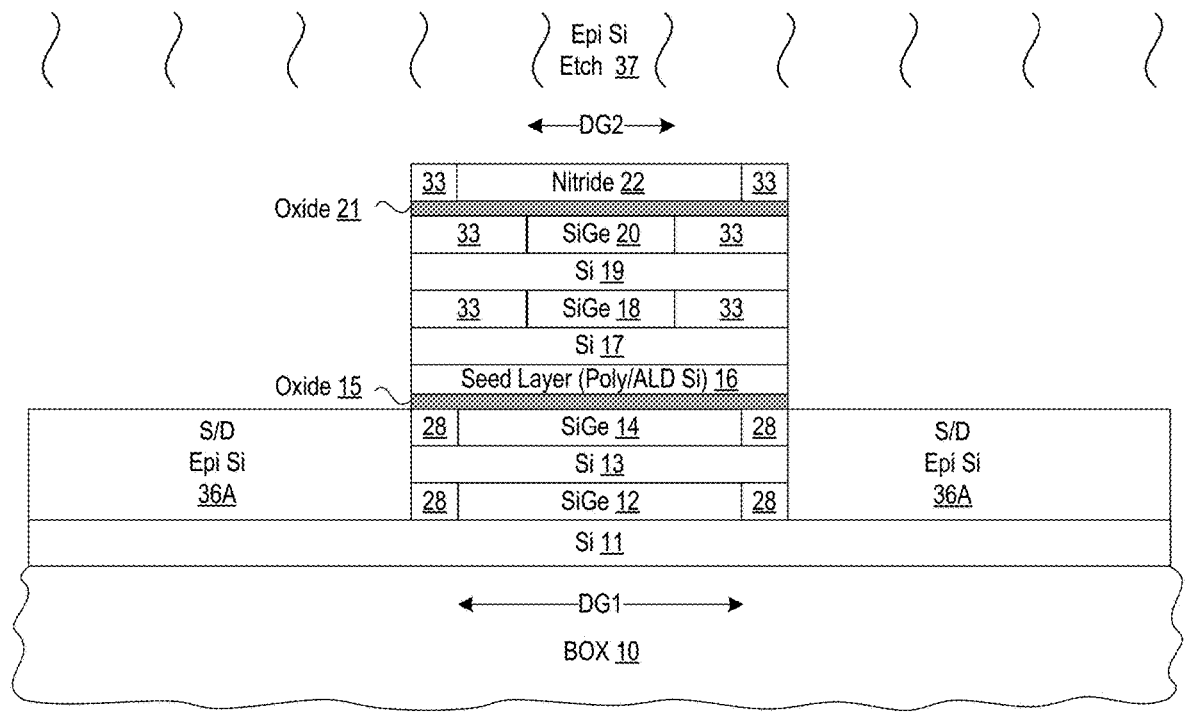
FIG. 11 illustrates processing subsequent to FIG. 10 after partially etching the epitaxial source/drain regions to form etched epitaxial source/drain regions which expose the top stacked Si/SiGe superlattice structure.

FIG. 11 illustrates processing of the semiconductor structure subsequent to FIG. 10 after an epitaxial silicon etch process 37 is applied to partially etch the epitaxial source/drain regions 36 to form etched epitaxial source/drain regions 36A which expose the top stacked Si/SiGe superlattice structure 17-20 and seed layer 16. With the protective nitride layer 22 and sidewall spacer 33 in the top layer forming a protective etch mask, any suitable epitaxial silicon etch process 37 may be used. For example, a timed directional epitaxial silicon etch process 37 (e.g., RIE) may be applied to recess the top surface of the source/drain regions 36 by controlling the etch timing to leave the uppermost surface of the etched source/drain regions 36A in substantial alignment with the upper surface of the bottom Si/SiGe superlattice structure 11-14. In this way, remnant or etched source/drain regions 36A are formed adjacent to the bottom Si/SiGe superlattice structure 11-14.

Figure 12:
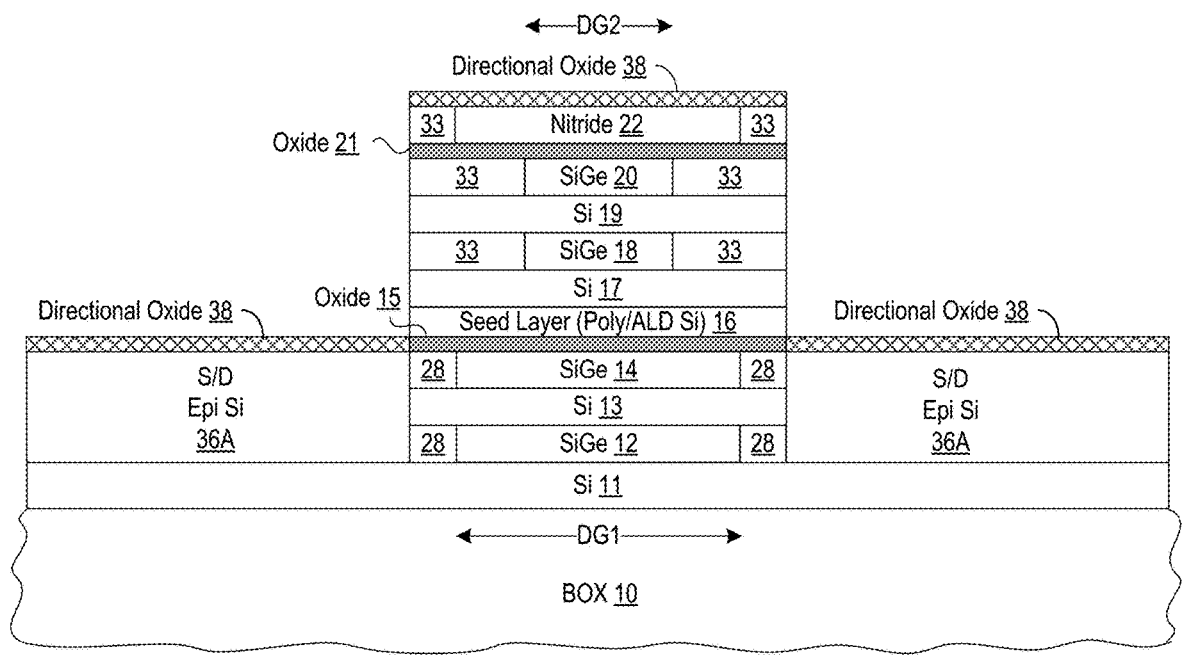
FIG. 12 illustrates processing subsequent to FIG. 11 after forming a directional oxide layer to cover the etched epitaxial source/drain regions.

FIG. 12 illustrates processing of the semiconductor structure subsequent to FIG. 11 after forming a directional insulating layer 38 to cover at least the etched epitaxial source/drain regions 36A. While any suitable process may be used, the directional insulating layer 38 may be formed by using PECVD to deposit a layer of tetraethyl orthosilicate (TEOS) as a directional oxide layer 38 on horizontal top surfaces on the etched source/drain regions 36A and transistor stack. To remove any remnant oxide from the vertical or sidewall surfaces, a short hydrofluoric (HF) acid etch may be applied to clear any thin oxide from sidewalls if necessary. As finally formed, the thickness and material for the directional insulating layer 38 should be chosen to provide electrical insulation between the stacked nanosheet transistors that are formed with the stacked top and bottom Si/SiGe superlattice structures.

Figure 13:
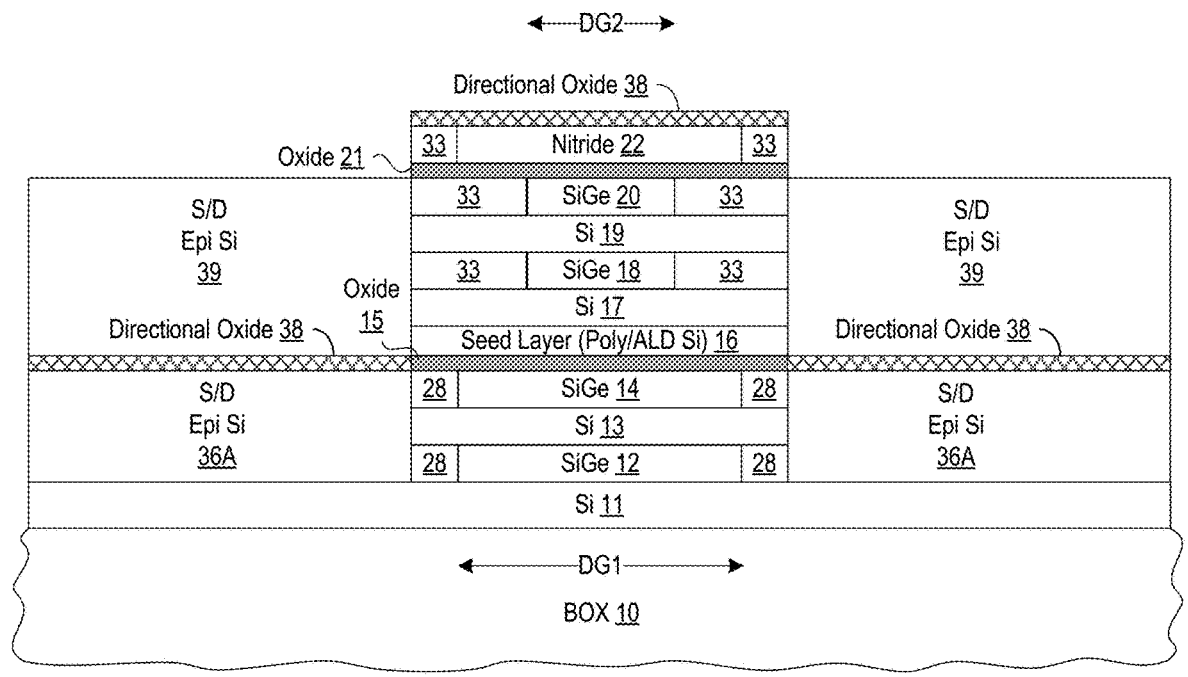
FIG. 13 illustrates processing subsequent to FIG. 12 after forming epitaxial source/drain regions which are separated from the etched epitaxial source/drain regions by the directional oxide layer and epitaxially grown to surround the exposed top stacked Si/SiGe superlattice structure.

FIG. 13 illustrates processing of the semiconductor structure subsequent to FIG. 12 after forming epitaxial source/drain regions 39 which are separated from the etched epitaxial source/drain regions 36A by the directional oxide layer 38 and which are formed to surround the exposed top stacked Si/SiGe superlattice structure 17-20, 33. While any suitable epitaxial source/drain fabrication sequence may be used, the source/drain regions 39 may be formed by epitaxially growing or depositing a semiconductor layer 39 (e.g., silicon) in the regions adjacent to the top stacked Si/SiGe superlattice structure 17-20. As will be appreciated, the epitaxial silicon deposition or growth process forms the epitaxial source/drain regions 39 from the seed layer 16 and any exposed silicon layers 17, 19. At this point, the epitaxial source/drain regions 39 can be doped using any suitable doping technique, such as by performing in-situ doping during the epi process with boron, arsenic and/or phosphorus to form doped epitaxial source/drain regions 39. Alternatively, an implantation process may be performed to dope the epitaxial source/drain regions 39. In either case, the doping dose used to dope the epitaxial source/drain regions 39 is greater than a doping dose (if any) used to dope the channel regions in the silicon layers 17, 19. In addition, the formation of the source/drain regions 39 may be performed with doping that is appropriate for the top Si/SiGe superlattice structure 17-20 to have N-type or P-type source/drain features. In some embodiments, after formation of the source/drain regions 39, an epi anneal process may be performed to promote formation of crystalline structures in the epitaxial source/drain regions 39. In addition, one or more etch or polish steps may be applied to planarize the top surface of the epitaxial source/drain regions 39 so that it is substantially level with the top of the top stacked Si/SiGe superlattice structure 17-20.

Figure 14:
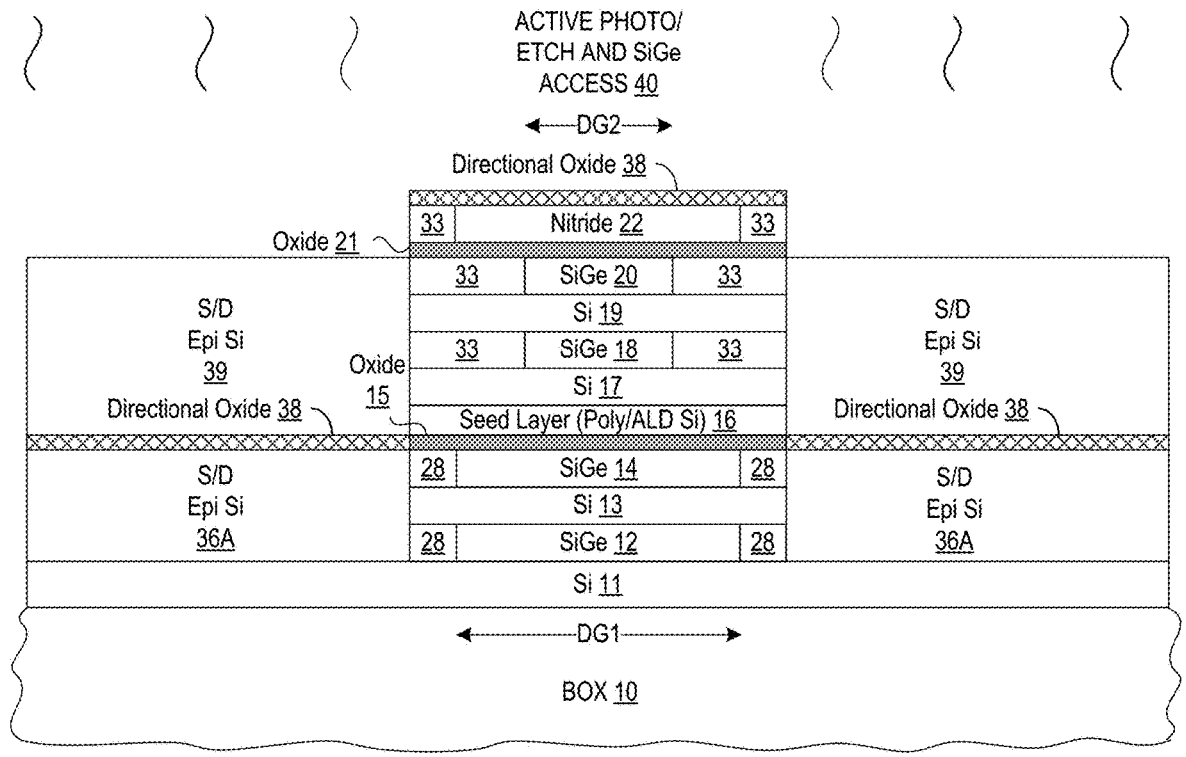
FIG. 14 illustrates processing subsequent to FIG. 13 after the transistor stack is patterned and etched to expose the SiGe layers in the transistor stack.

FIG. 14 illustrates processing of the semiconductor structure subsequent to FIG. 13 after the transistor stack is patterned and etched with an active photo/etch and SiGe access process 40 to expose the remnant SiGe layers 12, 14, 18, 20 in the transistor stack to a subsequent SiGe etch process. While the depicted cross-sectional drawing does not show etch openings that expose the remnant SiGe layers 12, 14, 18, 20, it will be appreciated that the etch openings may be formed in the z-axis plane (in and out of the paper) to expose peripheral ends of the remnant SiGe layers 12, 14, 18, 20. Though not shown, it will be appreciated that the photo/etch and SiGe access process 40 could also be used to form an etch opening which cuts the epitaxial source/drain region 39, 36A into separate portions of epitaxial silicon. While any suitable pattern and etch process may be used, the active photo/etch and SiGe access process 40 may include forming a patterned mask (not shown) over the semiconductor structure by depositing, patterning, etching or developing a photoresist or hard mask layer on the upper epitaxial source/drain regions 39 and transistor stack. With the openings formed in the patterned photoresist/hard mask, the active photo/etch and SiGe access process 40 may also include one or more etch processes that are applied to create SiGe access openings which expose at least the remnant SiGe layers 12, 14, 18, 20. The etch processing 40 can include performing a sequence of reactive-ion etching (RIE) steps having suitable etch chemistry properties to remove, in sequence, the exposed portions of the directional oxide layer 38, protective nitride layer 22, protective oxide layer 21, and underlying layers of the transistor stack 12-20.

Figure 15:
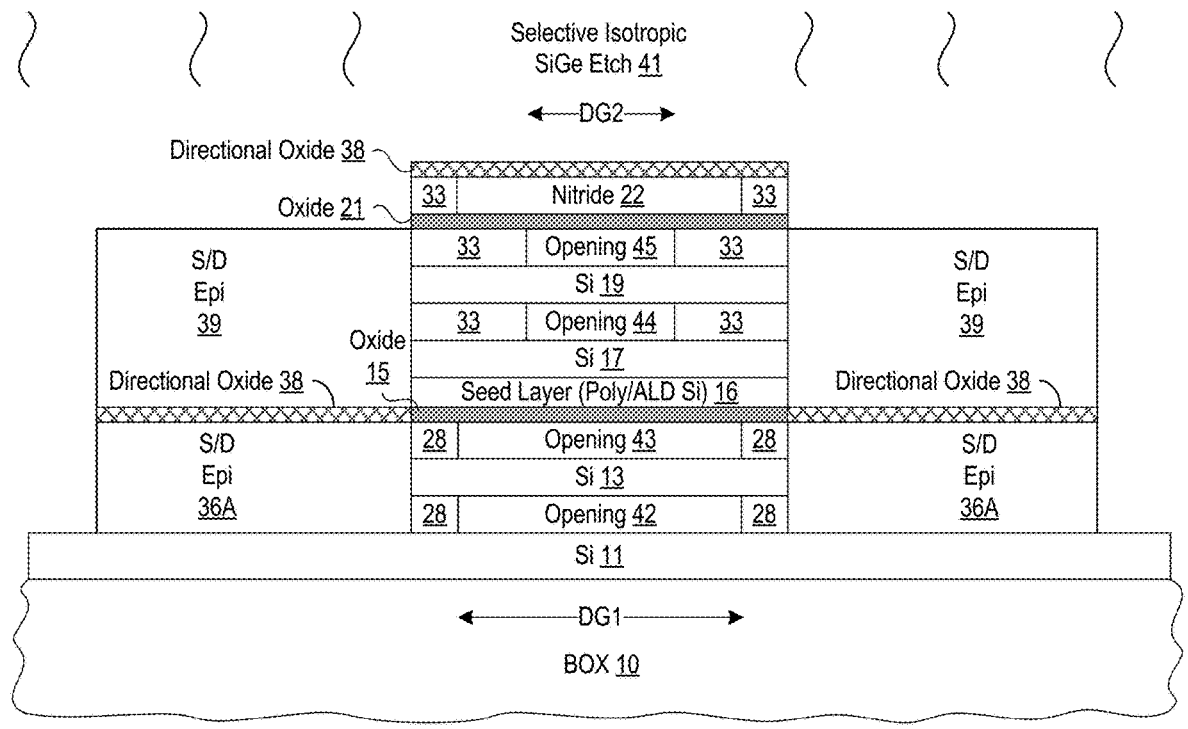
FIG. 15 illustrates processing subsequent to FIG. 14 after selectively etching exposed SiGe layers to form gate openings in the transistor stack.

FIG. 15 illustrates processing of the semiconductor structure subsequent to FIG. 14 after applying a SiGe etch process 41 to selectively etch exposed remnant SiGe layers 12, 14, 18, 20, thereby forming gate openings 42-45 in the transistor stack. While any suitable SiGe etch process may be used, a selective isotropic SiGe etch process 41, such as a timed isotropic dry etch, may be used to remove the exposed remnant SiGe layers 12, 14, 18, 20 from the transistor stack. At the conclusion of the SiGe etching process 41, the remnant SiGe portions 12, 14, 18, 20 of the transistor stack are replaced by gate openings 42-45 where the gate electrodes for the nanosheet transistors will be formed in the transistor stack.

Figure 16:
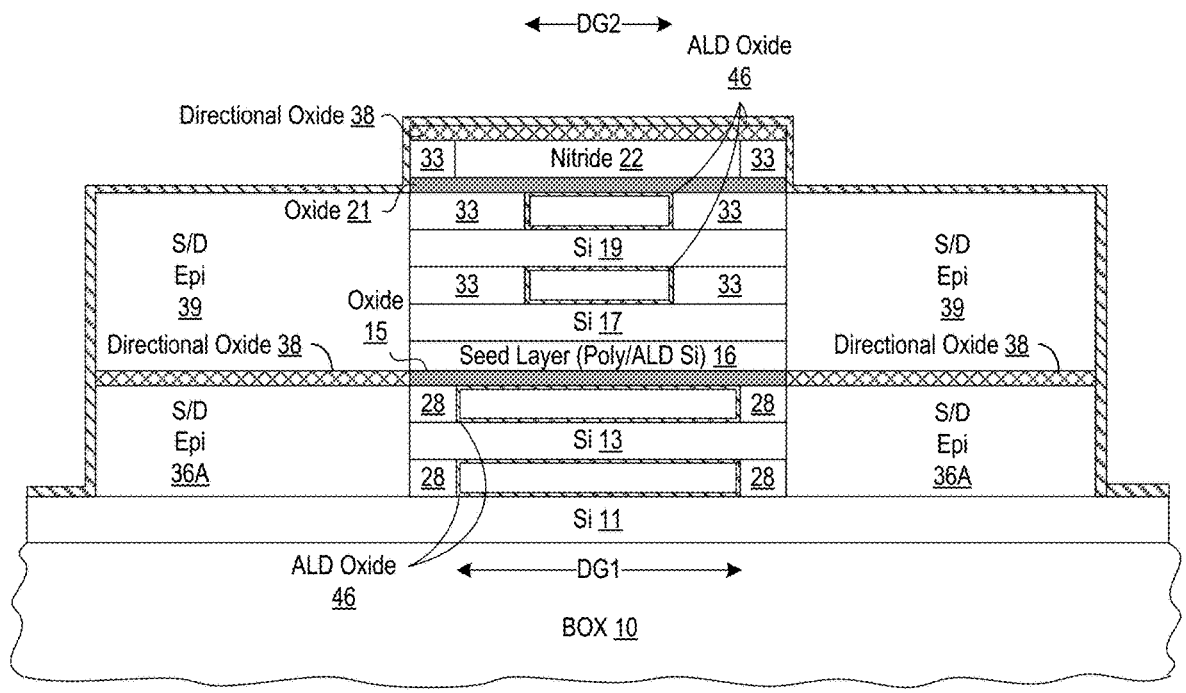
FIG. 16 illustrates processing subsequent to FIG. 15 after an atomic layer deposition (ALD) oxide layer is formed as a liner layer in at least the gate openings of the transistor stack.

FIG. 16 illustrates processing of the semiconductor structure subsequent to FIG. 15 after a conformal gate dielectric layer 46 is formed as a liner layer in at least the gate openings 42-45 of the transistor stack. In selected embodiments, the conformal gate dielectric layer 46 is formed with an atomic layer deposition (ALD) to conformally deposit an ALD oxide layer 46 to a desired gate dielectric thickness (e.g., 5-50 Angstroms) on the interior surfaces of the gate openings 42-45 without completely filling the gate openings. In selected embodiments, the ALD oxide deposition process may by implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. As a result, the ALD oxide deposition process offers accurate control of film thickness and composition as well as the ability to achieve excellent uniformity over large areas at relatively low temperatures. In addition to forming gate dielectric layers in the gate openings 42-45, the resulting ALD oxide 46 forms a substantially conformal layer over the upper surface of the semiconductor structure.

Figure 17:
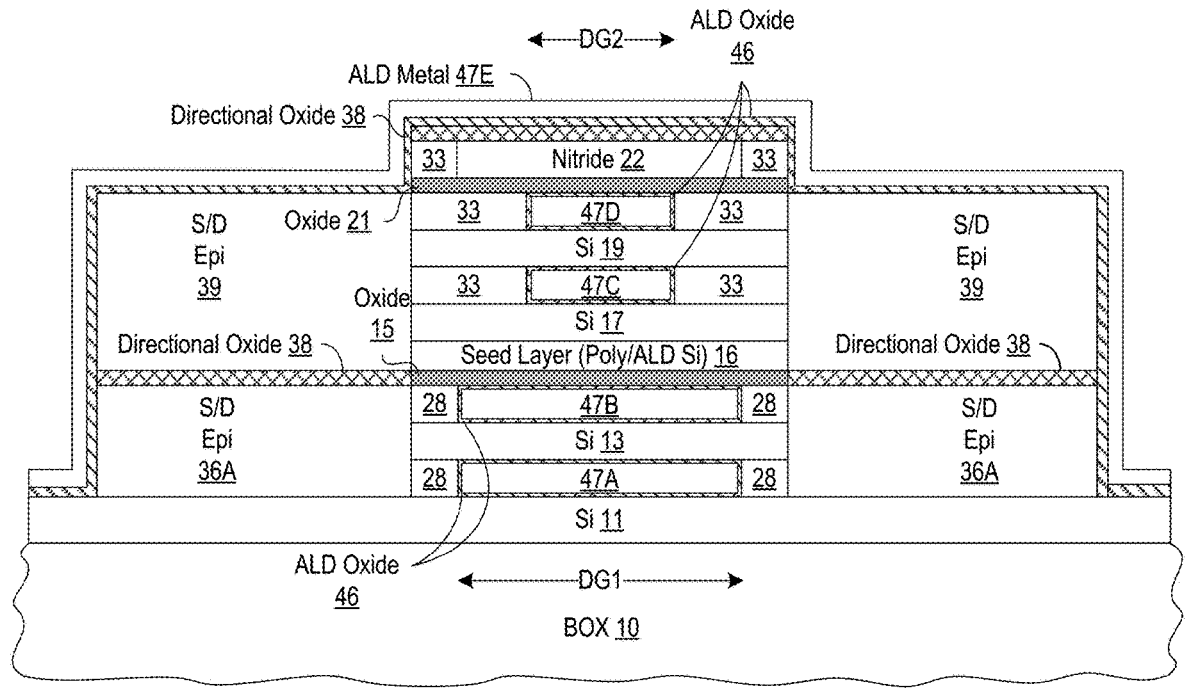
FIG. 17 illustrates processing subsequent to FIG. 16 after a first atomic layer deposition (ALD) metal layer is formed as a liner layer to at least fill the gate openings of the transistor stack.

FIG. 17 illustrates processing of the semiconductor structure subsequent to FIG. 16 after a first atomic layer deposition (ALD) metal layer 47 is formed as a liner layer, thereby forming gate electrodes 47A-D in remaining gate openings 42-45 of the transistor stack. In selected embodiments, the conductive gate electrode layer(s) 47A-D are formed with an atomic layer deposition (ALD) process to conformally deposit at least a first ALD metal layer 47A-D on the ALD oxide layers 46, thereby at least partially filling the remaining gate openings 42-45. In selected embodiments, the ALD metal deposition process may be implemented by exposing the semiconductor structure to a precursor, evacuating or purging the precursors as well as byproducts from the chamber, exposing the semiconductor structure to reactant species (e.g., metals or other reagents), and evacuating or purging the reactants and byproduct molecules from the chamber. In addition to forming gate electrode layers 47A-D in the gate openings 42-45, the ALD metal process forms an ALD metal layer 47E as a substantially conformal layer over the upper surface of the semiconductor structure.

Figure 18:
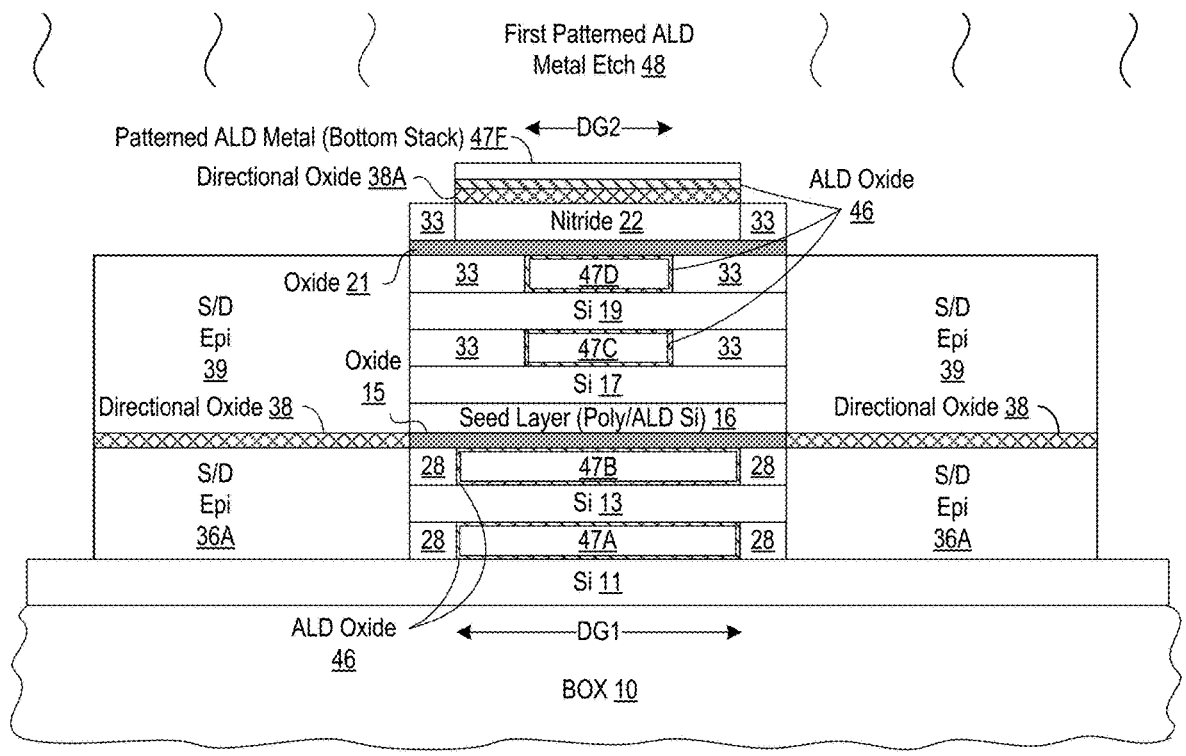
FIG. 18 illustrates processing subsequent to FIG. 17 after a first patterned metal etch process is applied to selectively remove the first ALD metal layer except for a first (wider) patterned ALD metal layer on the upper surface and sidewalls of the transistor stack having a dimension matching the first gate length dimension for the bottom nanosheet transistor.

FIG. 18 illustrates processing of the semiconductor structure subsequent to FIG. 17 after a first patterned metal etch process 48 is applied to selectively remove the first ALD metal layer 47 except for the bottom gate contact layers having a dimension matching the first gate length dimension DG1 for the bottom nanosheet transistor. As will be appreciated, the bottom gate contact layers having the first gate length dimension DG1 include the first patterned ALD metal layer 47F on the upper surface of the transistor stack, but may also include other patterned ALD metal layers 47 (not shown) which are positioned in the z-axis (e.g., not in the x-y plane of FIG. 18) to extend down the transistor stack sidewall to contact the bottom gate electrodes 47A, 47B of the bottom nanosheet transistor. Thus, the first ALD metal layer 47 and first ALD oxide layer 46 are patterned and etched with the first patterned metal etch process 48 to form the bottom gate contacts to electrically connect to gate electrodes 47A-B in the bottom nanosheet transistor(s) formed in the bottom nanosheet stack. While any suitable pattern and etch process may be used, the first patterned metal etch process 48 may include forming a patterned mask (not shown) over the semiconductor structure by depositing, patterning, etching or developing a photoresist or hard mask layer to define openings where one or more etch processes are applied to create the bottom gate contact layers, including the first patterned ALD metal layer 47F on the upper surface of the transistor stack. The etch processing 48 can include performing a sequence of reactive-ion etching (RIE) steps having suitable etch chemistry properties to remove, in sequence, the exposed portions of the ALD metal layer 47E, ALD oxide layer 46, and the directional oxide layer 38.

Figure 19:
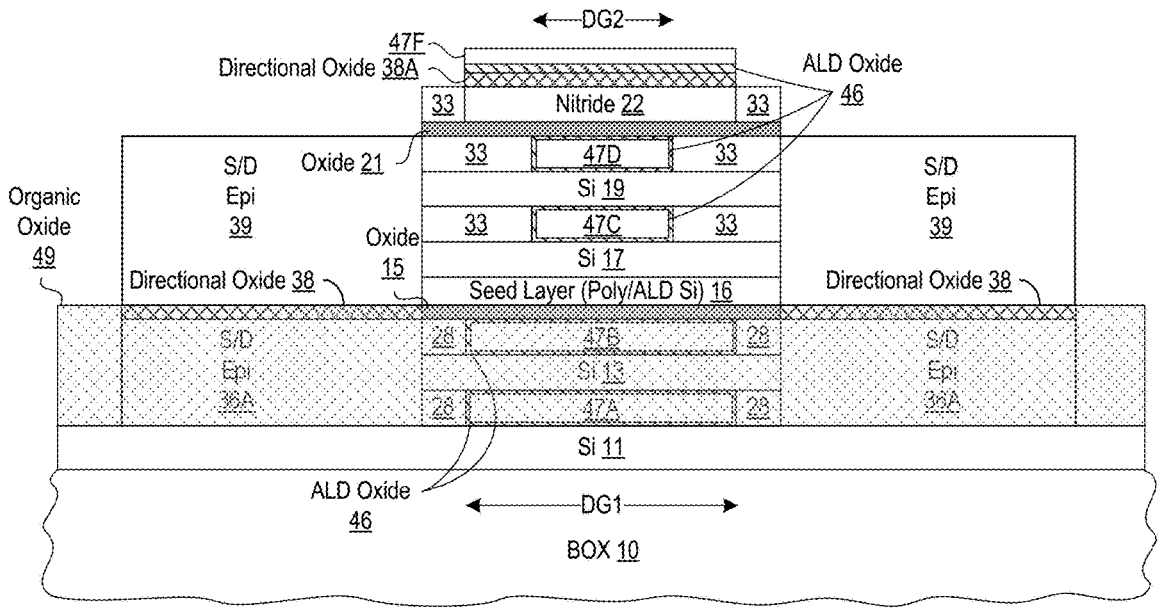
FIG. 19 illustrates processing subsequent to FIG. 18 after forming a second organic oxide layer to protect the bottom nanosheet transistor while the top nanosheet transistor stack is processed to define a smaller gate length dimension.

FIG. 19 illustrates processing of the semiconductor structure subsequent to FIG. 18 after forming a second organic oxide layer 49 or other suitable protective structure over the substrate to protect the bottom nanosheet transistor formed in the bottom nanosheet stack while the top nanosheet transistor formed in the top nanosheet stack is processed to define a smaller gate length dimension. In selected embodiments, the second organic oxide layer 49 may be formed with a deposition process where a layer of organic oxide is spun on like resist to flow into the low regions of the semiconductor structure. By controlling the amount of organic oxide layer 49 that is deposited to fill up to the oxide barrier layer 15, the organic oxide layer 49 covers the bottom nanosheet transistor channels 11, 13, gate electrodes 47A/B, and etched epi source/drain regions 36A to protect the bottom nanosheet transistor while the top nanosheet transistor is subsequently processed.

Figure 20:
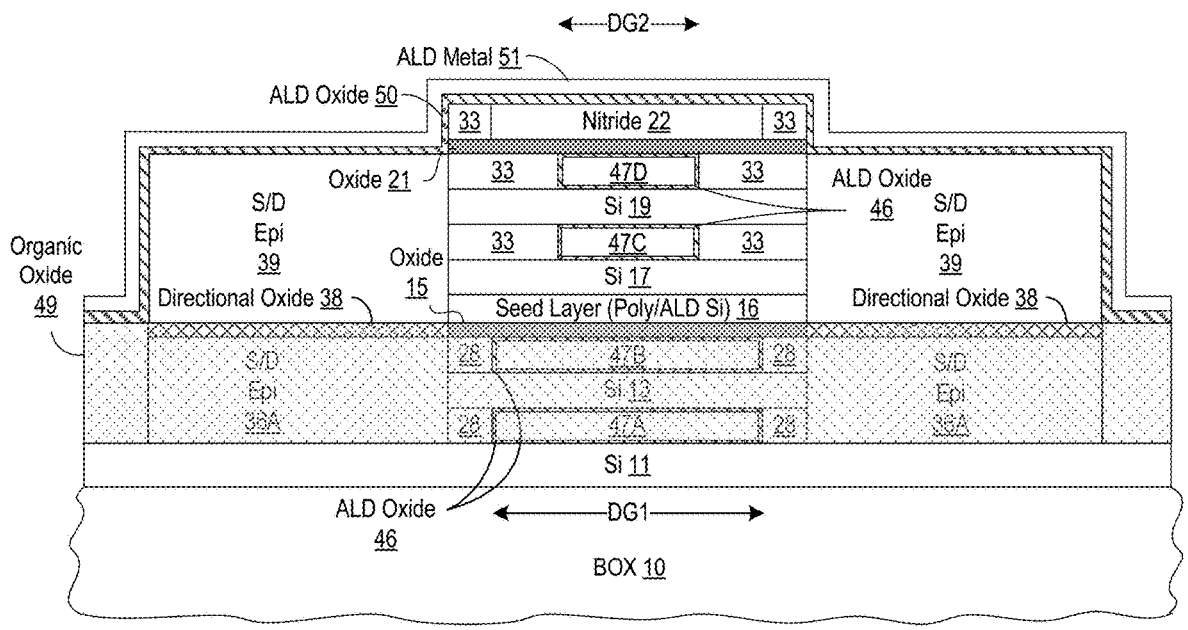
FIG. 20 illustrates processing subsequent to FIG. 19 after removing the first patterned ALD metal layer and forming a second ALD oxide layer and a second ALD metal layer over the top nanosheet transistor stack.

FIG. 20 illustrates processing of the semiconductor structure subsequent to FIG. 19 after forming a second ALD oxide layer 50 and a second ALD metal layer 51 over the transistor stack. At the depicted stage of processing, the first patterned ALD metal layer 47F, first ALD oxide layer 46, and directional oxide 38A have been removed from the top and sidewalls of the nanosheet stack above organic oxide layer 49 using any suitable etch and/or stripping process, leaving the protective nitride layer 22 and sidewall spacer 33 in the top layer in place over the transistor stack. Subsequently, a second ALD oxide layer 50 and second ALD metal layer 51 are sequentially deposited over the top and sides of the semiconductor structure, including the transistor stack, upper source/drain epi regions 39, and second organic oxide layer 49. For example, the second ALD oxide layer 50 is deposited as a conformal layer to a predetermined thickness (e.g., 5-50 Angstroms), followed by deposition of the second ALD metal layer 51 to a predetermined thickness. As a result, the second ALD oxide layer 50 and second ALD metal layer 51 are conformally formed on the top and sides of the transistor stack to make electrical contact with the gate electrodes 47C, 47D of the top nanosheet transistor(s) formed in the top nanosheet stack.

Figure 21:
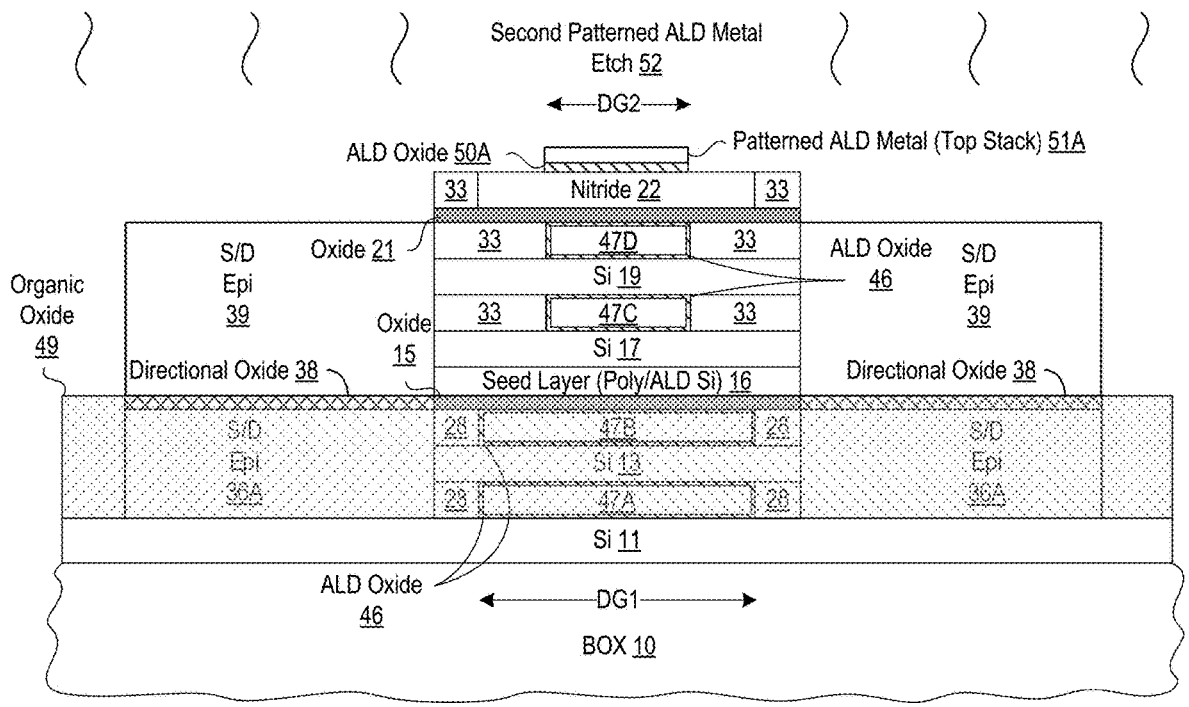
FIG. 21 illustrates processing subsequent to FIG. 20 after a second patterned metal etch process is applied to selectively remove the second ALD metal layer except for a second (narrower) patterned ALD metal layer on the upper surface and sidewalls of the transistor stack having a dimension matching the second gate length dimension of the top nanosheet transistor.

FIG. 21 illustrates processing of the semiconductor structure subsequent to FIG. 20 after a second patterned metal etch process 52 is applied to selectively remove the second ALD metal layer 51 except for the top gate contact layers having a dimension matching the second gate length dimension DG2 for the top nanosheet transistor. As will be appreciated, the top gate contact layers having the second gate length dimension DG2 include the second patterned ALD metal layer 51A and second patterned ALD oxide layer 50A on the upper surface of the transistor stack, but may also include other patterned ALD metal layers 51 (not shown) which are positioned in the z-axis (e.g., not in the x-y plane of FIG. 21) to extend down the transistor stack sidewall to contact the top gate electrodes 47C, 47D of the top nanosheet transistor. Thus, the second ALD metal layer 51 and second ALD oxide layer 50 are patterned and etched with the second patterned metal etch process 52 to form the top gate contacts to electrically connect to gate electrodes 47C-D for the top nanosheet transistor(s) formed in the top nanosheet stack. While any suitable pattern and etch process may be used, the second patterned metal etch process 52 may include forming a patterned mask (not shown) over the semiconductor structure by depositing, patterning, etching or developing a photoresist or hard mask layer to define openings where one or more etch processes are applied to create the top gate contact layers, including the second patterned ALD metal layer 51A on the upper surface of the transistor stack. The etch processing 52 can include performing a sequence of reactive-ion etching (RIE) steps having suitable etch chemistry properties to remove, in sequence, the exposed portions of the second ALD metal layer 51 and second ALD oxide layer 50, thereby leaving the underlying patterned second ALD metal layer 51A and patterned second ALD oxide layer 50A.

Figure 22:
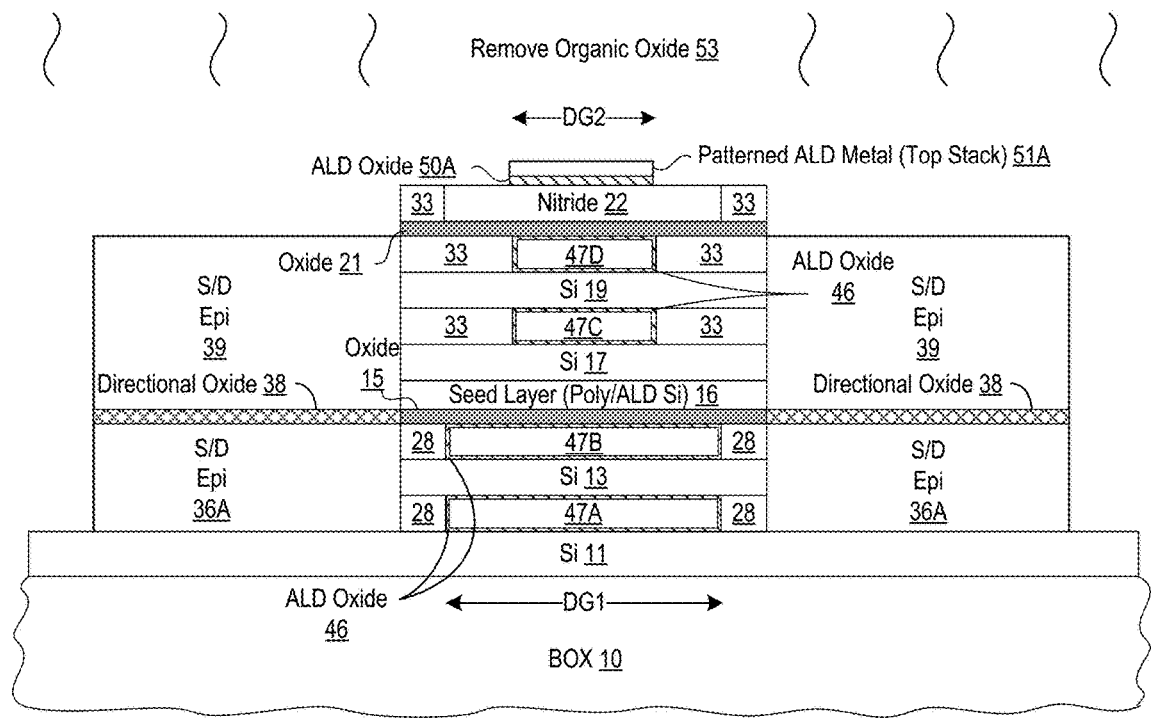
FIG. 22 illustrates processing subsequent to FIG. 21 after removing the second organic oxide layer from the transistor stack.

FIG. 22 illustrates processing of the semiconductor structure subsequent to FIG. 21 after an oxide removal process 53 is applied to selectively remove the second organic oxide layer 49 from the transistor stack. While any suitable etch process 53 may be used, the etch processing can include one or more isotropic etch steps (e.g., a wet etch process) having suitable etch chemistry properties to remove the second organic oxide layer 49 from the bottom nanosheet transistor. By using an isotropic wet etch process designed to etch organic oxide specifically, the second patterned ALD oxide layer 50A, protective oxide layer 21, and remnant directional oxide 38 on the etched source/drain regions 36A will be partially etched at the exposed sidewalls, but are depicted as having substantially vertical sidewalls since there will be only minor deviations in the sidewall profile caused by the wet etch process.

At the process stage shown in FIG. 22, the fabrication of the stacked top and bottom nanosheet transistors in the transistor stack is complete except for any silicidation, though additional processing steps can be performed to form additional circuit elements, such as sidewall capacitors and/or non-volatile memory cells. As shown, the depicted transistor stack includes a bottom nanosheet transistor stack and a top nanosheet transistor stack. The depicted bottom nanosheet transistor stack includes a first nanosheet transistor which includes the first silicon channel region 13 under control of gate electrodes 47A, 47B, and a second planar FET transistor including the first silicon channel region 11 under control of the gate electrode 47A. However, the second planar FET transistor could be replaced with a second nanosheet transistor by patterning and etching the silicon layer 11 to match the patterned silicon layer 13 and including an additional SiGe layer (not shown) below the first silicon channel region 11 which is processed with the same steps applied to the SiGe layer 12 described hereinabove to form a gate electrode for the bottom nanosheet transistor stack. In similar fashion, the depicted top nanosheet transistor stack includes a third nanosheet transistor which includes the silicon channel region 19 under control of gate electrodes 47C, 47D, and a fourth planar FET transistor including the silicon channel region 17 and seed layer 16 under control of the gate electrode 47C. Again, the fourth planar FET transistor could be replaced with a nanosheet transistor by including an additional SiGe layer (not shown) below the silicon channel region 17 which is processed with the same steps applied to the SiGe layers described hereinabove to form a gate electrode for the top nanosheet transistor stack.

Figure 23:
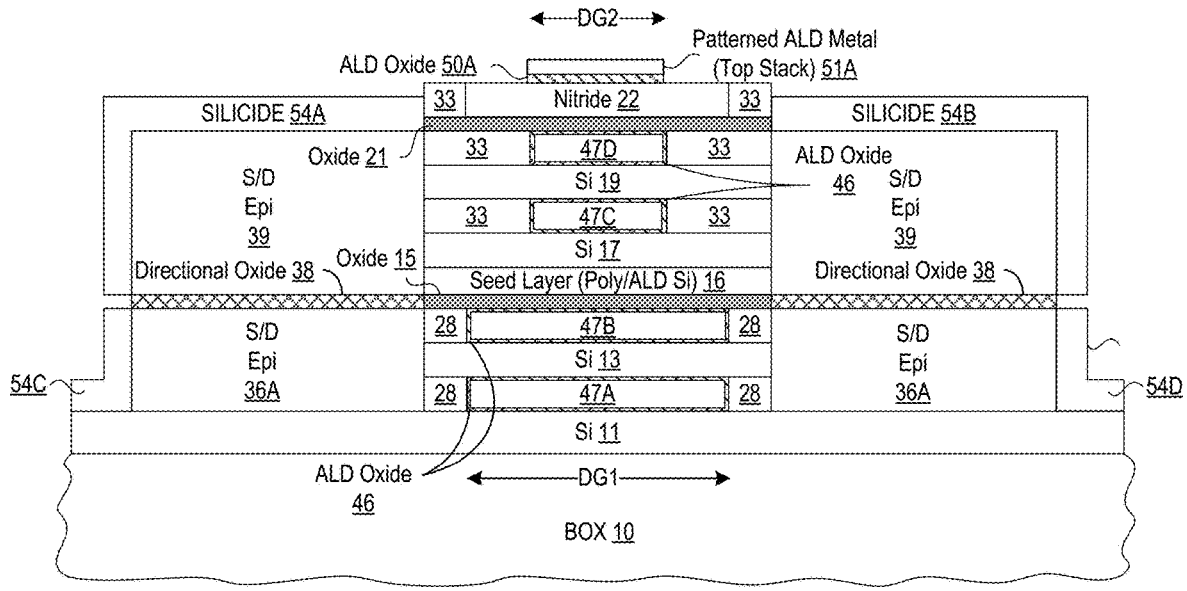
FIG. 23 illustrates processing subsequent to FIG. 22 after selectively forming silicide layers on the exposed epitaxial source/drain regions.

FIG. 23 illustrates processing of the semiconductor structure subsequent to FIG. 22 after selectively forming silicide layers 54A-D on the exposed epitaxial source/drain regions 36A, 39. As formed, the silicide layers 54A-B facilitate electrical connection to the epitaxial source/drain regions 39, while the silicide layers 54C-D facilitate electrical connection to the etched epitaxial source/drain regions 36A. While any desired silicide formation process may be used to form the silicide layers 54A-D (such as $CoSi_2$ or NiSi), an example silicide formation sequence would be to deposit or sputter a conductive or metal layer (e.g., cobalt or nickel) over the semiconductor structure, followed by a heating step to react the metal layer with the source/drain regions 36A, 39 to form silicide layers 54A-D. As depicted, there is no silicide formed on the exposed directional oxide 38, thereby forming a first gap between the silicide layers 54A, 54C and a second gap between the silicide layers 54B, 54D. In an illustrative embodiment, the reaction of the metal layer and the source/drain regions 36A, 39 is promoted by performing an initial rapid thermal anneal step (e.g., 400-600° C.), followed by a Piranha clean step to remove excess metal, and then followed by a second rapid thermal anneal step (e.g., 650-850° C.). The time and temperature of the initial rapid thermal anneal step are selected so that the metal layer reacts with the exposed surfaces of the source/drain regions 36A, 39. After the Piranha clean step, the time and temperature of the second rapid thermal anneal step are selected so that the reacted silicide 54A-D is pushed into a low resistivity phase.

Figure 24:
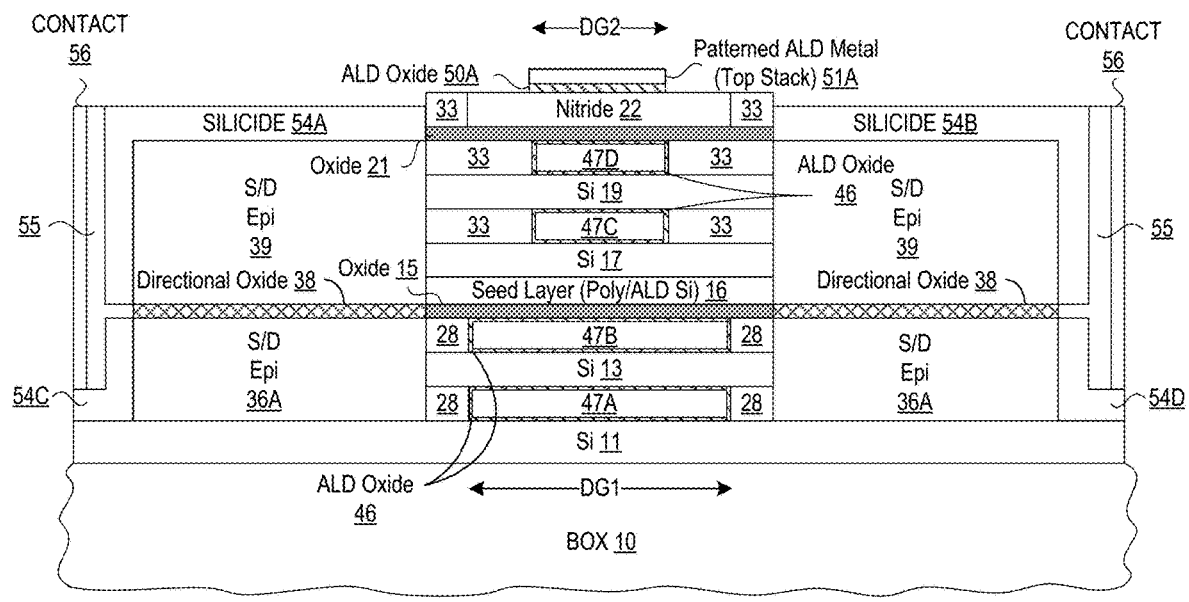
FIG. 24 illustrates processing subsequent to FIG. 23 after forming contacts to silicide layers for the bottom nanosheet transistor stack.

FIG. 24 illustrates processing of the semiconductor structure subsequent to FIG. 23 after forming contacts 56 to the silicide layers 54C, 54D for the bottom nanosheet transistor stack. While any suitable contact formation process may be used, an example sequence may include forming an insulating layer 55 on the sidewalls of the silicide layers 54A-D, such as by depositing an insulating oxide or nitride layer over the semiconductor structure which is then etched and/or polished to substantially level with the top surface of the silicide layers 54A, 54B. Subsequently, a patterned contact etch mask (not shown) may be formed over the insulating layer 55 by depositing, patterning, etching or developing a photoresist or hard mask layer to define openings where one or more etch processes are applied to create the contact etch openings, such as by performing a sequence of reactive-ion etching (RIE) steps having suitable etch chemistry properties to remove exposed portions of the insulating layer 55 and to create the contact openings to the underlying silicide layers 54C, 54D. Subsequently, the contact openings may be filled with conductive material 56 to make electrical contact with the underlying silicide layers 54C, 54D, such as by depositing one or more conductive layers using CVD, PECVD, PVD, ALD, sputtering, or any combination(s) of the above to fill the contact openings in the insulating layer 55. In addition, a planarization process may be applied to remove excess conductive material, such as by using a chemical mechanical polish (CMP) process. At this point, additional interconnects and conductors are formed with any desired Middle End Of Line (MEOL) and Back End of Line (BEOL) processing steps.

As a result of the processing steps illustrated in FIGS. 1-24, there is provided a nanosheet transistor stack formed with a top nanosheet transistor and bottom nanosheet transistor having different gate electrode lengths and separated from one another by a barrier oxide layer 15, thereby providing a straightforward method for integrating stacked nanosheet transistors having different gate lengths in the same stack. While specific implementation details are described herein for integrating the fabrication of nanosheet transistors with different gate lengths to make dual use of fabrication steps, it will be appreciated that additional or fewer processing steps may be used and/or combined. And depending upon the electrical connection and doping types used for the source/drain regions 36A, 39 and silicon channel regions 11, 13, 17, 19, as well as the ALD oxide and ALD metal gate materials used, the transistor stack may be configured with NMOS nanosheet transistors, PMOS nanosheet transistors, or a combination of NMOS and PMOS nanosheet transistors.

Figure 25:
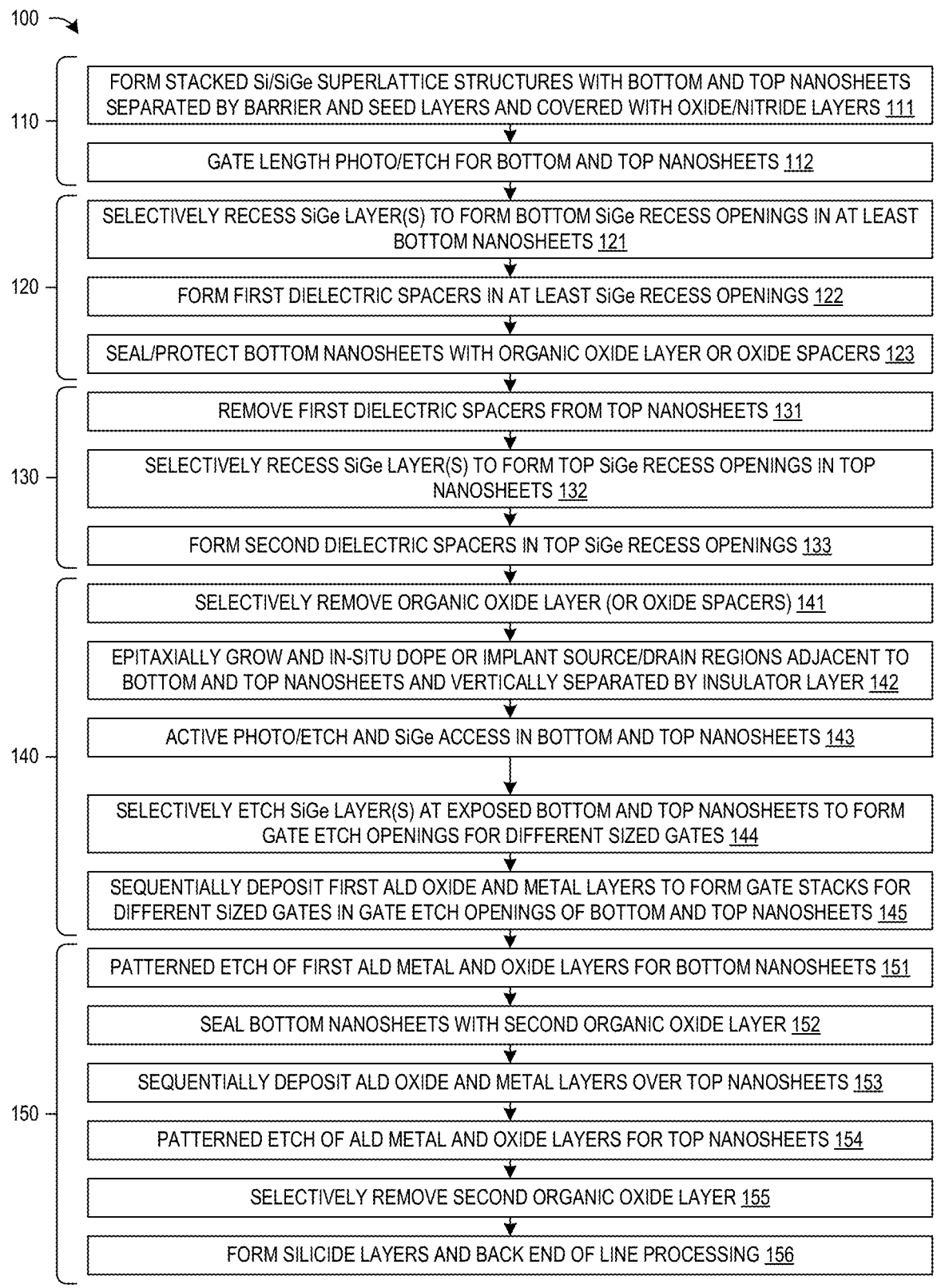
FIG. 25 illustrates a simplified process flow for fabricating stacked nanosheet transistors having different gate length dimensions in accordance with selected embodiments of the present disclosure.

Turning now to FIG. 25, there is illustrated a simplified process flow 100 for fabricating stacked nanosheet transistors having different gate length dimensions in accordance with selected embodiments of the present disclosure. Stated generally, the process includes an initial set of fabrication steps 110 to fabricate a wafer substrate with a patterned transistor stack that includes bottom and top Si/SiGe superlattice structures separated from one another by a barrier oxide layer. A second set of fabrication steps 120 processes the patterned transistor stack to form and protect remnant SiGe layers in the bottom Si/SiGe superlattice structure having a first gate length dimension. A third set of fabrication steps 130 processes the patterned transistor stack to form and protect remnant SiGe layers in the top Si/SiGe superlattice structure having a second, smaller gate length dimension. A fourth set of fabrication steps 140 processes the patterned transistor stack to form bottom and top nanosheet transistors by separately forming source/drain regions for the bottom and top nanosheet transistors and by using selective SiGe etch and ALD deposition processes to form gate electrodes having different gate length dimensions from the remnant SiGe layers in the bottom and top nanosheet transistors. A fifth set of fabrication steps 150 processes the patterned transistor stack to separately form bottom and top gate contact layers to the gate electrodes in the bottom and top nanosheet transistors and to separately form silicide and contact layers to the source/drain regions for the bottom and top nanosheet transistors. As will be appreciated, each set of fabrication steps 110, 120, 130, 140, 150 can be implemented in different embodiments using the processing steps disclosed herein or modifications thereto as will be understood by those skilled in the art. However, by way of illustrating selected example embodiments of the present disclosure, each set of fabrication steps 110, 120, 130, 140, 150 is described hereinbelow with an example processing step sequence.

Starting with the initial set of fabrication steps 110, the process 100 may begin at step 111 with a wafer substrate which is processed to form stacked silicon/silicon germanium superlattice structures on the wafer substrate. In selected embodiments, the stacked silicon/silicon germanium superlattice structures are formed with stacked bottom and top Si/SiGe nanosheets, where the bottom Si/SiGe nanosheets are formed by epitaxially growing alternating layers of Si and SiGe on a silicon-on-insulator (SOI) substrate layer, where a barrier layer (e.g., oxide) and seed layer (e.g., poly or ALD silicon) are formed on the bottom Si/SiGe nanosheets, where the top Si/SiGe nanosheets are formed by epitaxially growing alternating layers of Si and SiGe on the seed layer, and where the top Si/SiGe nanosheets are covered by depositing an oxide protective layer and/or a protective nitride layer.

The initial set of fabrication steps 110 may also include a gate length photo and etch step 112 where the stacked bottom and top Si/SiGe nanosheets are processed with a gate length photo/etch process to form a transistor stack. For example, a photoresist layer may be deposited, patterned, etched and developed to form a patterned photoresist or hard mask layer on the protective oxide or nitride layer. With the patterned photoresist/hard mask layer in place, the processing at step 112 may include applying one or more etch processes to create a transistor stack. The etch processing can include a sequence of reactive-ion etching (RIE) steps having suitable etch chemistry properties to sequentially remove exposed portions of the protective oxide or nitride and underlying layers of the stacked bottom and top Si/SiGe nanosheets.

To process the patterned transistor stack to form and protect remnant SiGe layers in the bottom nanosheets having a first gate length dimension, the disclosed second set of fabrication steps 120 may include a SiGe selective etch step 121 where SiGe layers at the exposed sides of the transistor stack are selectively etched or recessed to form SiGe recess openings in at least the bottom Si/SiGe nanosheets. For example, a controlled etch process, such as a timed isotropic dry etch, may be applied to selectively recess the SiGe layers exposed at the sides of the transistor stack, thereby forming SiGe recess openings in the stacked bottom and top Si/SiGe nanosheets by partially recessing SiGe layers.

The second set of fabrication steps 120 may also include a dielectric spacer formation step 122 where the SiGe recess openings of the transistor stack are filled with one or more dielectric layers. For example, a first inner nitride layer may be deposited over the semiconductor structure, and then patterned and isotropically etched to leave the inner nitride layer only in the SiGe recess openings of the transistor stack.

The second set of fabrication steps 120 may also include a bottom nanosheet protection step 123 where an organic oxide layer is formed over the substrate structure to protect or seal the bottom nanosheets. For example, a layer of organic oxide may be deposited and spun on to flow into the low regions of the semiconductor structure. By controlling the deposition quantity, the deposited organic oxide fills up to the oxide barrier layer to cover the bottom nanosheets while leaving exposed the top nanosheets. Alternatively, oxide sidewall spacers could be formed at step 123 to protect the bottom nanosheets by depositing and anisotropically etching an oxide layer to form oxide sidewall spacers to protect the bottom nanosheets while the top nanosheets are subsequently processed. At this point in the fabrication process 100, the transistor stack includes remnant SiGe layers in the bottom nanosheets that have a first gate length dimension and that are protected against the third set of fabrication steps 130 for defining the remnant SiGe layers in the top nanosheets to have a second, smaller gate length dimension.

To process the patterned transistor stack to form and protect remnant SiGe layers in the top nanosheets having a second, smaller gate length dimension, the disclosed third set of fabrication steps 130 may include a dielectric spacer removal step 131 to selectively remove the first dielectric spacers from the exposed top nanosheets. For example, the dielectric spacer removal step 131 may use a selective nitride etch process to remove exposed first inner nitride spacers from the top nanosheets, thereby forming recess openings which expose the remnant SiGe layers in the top nanosheets.

The third set of fabrication steps 130 may also include a SiGe selective etch step 132 where remnant SiGe layers at the exposed sides of the top nanosheets are selectively etched or recessed to form top SiGe recess openings. For example, a controlled etch process, such as a timed isotropic dry etch, may be applied to selectively recess the remnant SiGe layers exposed at the sides of the top nanosheets, thereby forming remnant SiGe layers in the top nanosheets that have a second gate length dimension that is shorter than the first gate length dimension.

The third set of fabrication steps 130 may also include a dielectric spacer formation step 133 where the top SiGe recess openings of the transistor stack are filled with one or more dielectric layers. For example, a second inner nitride layer may be deposited over the semiconductor structure, and then patterned and isotropically etched to leave the inner nitride layer only in the top SiGe recess openings of the transistor stack. At this point in the fabrication process 100, the transistor stack includes remnant SiGe layers in the bottom nanosheets that have a first gate length dimension, and also includes remnant SiGe layers in the top nanosheets that have a second, smaller gate length dimension.

To process the patterned transistor stack to form bottom and top nanosheet transistors, the disclosed fourth set of fabrication steps 140 may selectively remove the organic oxide layer (or oxide sidewall spacers) at step 141. For example, an oxide etch process, such as an isotropic wet etch process, may be applied to selectively remove the organic oxide layer from the transistor stack, where the oxide etch chemistry is selected to not etch the remaining layers of the bottom and top nanosheets.

The fourth set of fabrication steps 140 may also include one or more source/drain formation step(s) 142 for separately forming source/drain regions for the bottom and top nanosheet transistors. For example, a first epitaxial silicon deposition or growth process may be used to form first epitaxial source/drain regions to surround the transistor stack up to the height of the bottom nanosheets, either by a controlled epitaxial growth process or an overgrowth process coupled with epitaxial silicon etch and/or polish steps. Depending on the type of nanosheet transistor formed in the bottom nanosheets, the first epitaxial source/drain regions may be doped or implanted with N-type or P-type impurities. After forming the first epitaxial source/drain regions, an insulating layer is formed, such as by using PECVD TEOS to form a directional oxide on top of the first epitaxial source/drain regions. Subsequently, a second epitaxial silicon deposition or growth process may be used to form second epitaxial source/drain regions over the insulation layer to surround the top nanosheets, either by a controlled epitaxial growth process or an overgrowth process coupled with epitaxial silicon etch and/or polish steps. Depending on the type of nanosheet transistor formed in the top nanosheets, the second epitaxial source/drain regions may be doped or implanted with N-type or P-type impurities. In addition, the formation of doped epitaxial source/drain regions may include one or more anneal processes to promote formation of crystalline structures in the epitaxial source/drain regions and/or may include one or more etch or polish steps to planarize the top surface of the epitaxial source/drain regions.

The fourth set of fabrication steps 140 may also include an active photo and etch step 143 where the transistor stack is processed with an active photo/etch process to access the underlying SiGe layers in the transistor stack. For example, a photoresist layer may be deposited, patterned, etched and developed to form a patterned photoresist or hard mask layer with mask openings positioned over the transistor stack to access the underlying remnant SiGe layers in the transistor stack. With the patterned photoresist/hard mask layer in place, the photo/etch process may include applying one or more etch processes to access the underlying remnant SiGe layers in the transistor stack. The etch processing can include a sequence of reactive-ion etching (RIE) steps having suitable etch chemistry properties to sequentially remove exposed portions of the underlying layers, but without removing the accessed SiGe layers.

The fourth set of fabrication steps 140 may also include a SiGe selective etch step 144 for selectively etching the underlying remnant SiGe layers in the transistor stack. For example, a controlled etch process, such as a timed isotropic dry etch, may be applied to selectively etch and remove the remnant SiGe layers exposed at the transistor stack, thereby forming gate etch openings where the remnant SiGe layers were located in the transistor stack. Since the remnant SiGe layers in the bottom and top nanosheets have different gate length dimensions, the resulting gate etch openings formed by removing the remnant SiGe layers will have different gate length dimensions.

The fourth set of fabrication steps 140 may also include a gate stack or electrode formation step 145 for forming gate electrodes in the gate etch openings of the transistor stack by sequentially depositing first ALD oxide and metal layers. For example, the gate stacks or electrodes may be formed by depositing a first ALD oxide layer to form a conformal thin dielectric layer in the gate etch openings of the transistor stack, and then depositing a first ALD metal layer to form gate electrodes by filling the gate etch openings. Since the gate etch openings in the bottom and top nanosheets have different gate length dimensions, the resulting gate stacks or electrodes formed at step 145 will have different gate length dimensions.

To process the patterned transistor stack to separately form bottom and top gate contact layers to the gate electrodes in the bottom and top nanosheet transistors, the disclosed fifth set of fabrication steps 150 may include a first patterned etch step 151 to pattern and etch the first ALD metal and oxide layers to form bottom gate contact layers having a dimension matching the first gate length dimension DG1 for the bottom nanosheet transistor. For example, a first patterned metal etch process may be applied to selectively remove the first ALD metal and oxide layers to form the bottom gate contact layers which electrically connect to gate electrodes in the bottom nanosheets, such as by forming a patterned mask over the semiconductor structure with defined openings where one or more etch processes are applied to create the bottom gate contact layers by etching the first ALD metal and oxide layers.

The fifth set of fabrication steps 150 may also include a bottom nanosheet sealing step 152 where a second organic oxide layer is formed over the substrate structure to protect or seal the bottom nanosheets, such as by depositing and spinning on organic oxide to flow into the low regions of the semiconductor structure and to cover the bottom nanosheets while leaving exposed the top nanosheets. At this point in the fabrication process 100, the transistor stack includes gate electrodes and bottom contact layers in the bottom nanosheets that have a first gate length dimension and that are protected by the second organic layer against subsequent fabrication steps for defining the top contact layers.

To form the top contact layers for the top nanosheet transistors, the fifth set of fabrication steps 150 may also sequentially deposit second ALD oxide and metal layers over the semiconductor structures at step 153. The remaining patterned first ALD metal and oxide layers are removed or etched, and then a second ALD oxide layer may be deposited to form a conformal thin dielectric layer on the transistor stack, followed by deposition of a second ALD metal layer.

To process the second ALD metal and oxide layers to form top gate contact layers to the gate electrodes in the top nanosheet transistors, the disclosed fifth set of fabrication steps 150 may include a second patterned etch step 154 to pattern and etch the second ALD metal and oxide layers to form top gate contact layers having a dimension matching the second gate length dimension DG2 for the top nanosheet transistor. For example, a second patterned metal etch process may be applied to selectively remove the second ALD metal and oxide layers to form the top gate contact layers which electrically connect to gate electrodes in the top nanosheets. The horizontal surfaces of the top and bottom gate contact layers may be separated, or isolated, by the second ALD oxide layer and/or by a directional oxide deposited prior to deposition of the second ALD oxide and metal layers.

The disclosed fifth set of fabrication steps 150 may selectively remove the second organic oxide layer at step 155. For example, an oxide etch process, such as an isotropic wet etch process, may be applied to selectively remove the second organic oxide layer from the transistor stack, where the oxide etch chemistry is selected to not etch the remaining layers of the bottom and top nanosheets.

At this process stage, the front end of line processing of the bottom and top nanosheet transistors in the transistor stack is complete except for any silicidation, though additional processing steps can be performed to form additional circuit elements, such as sidewall capacitors and/or non-volatile memory cells.

The disclosed fifth set of fabrication steps 150 may use one or more steps 156 to form silicide layers along with any required back-end-of-line processing to form contacts. For example, the silicide formation sequence of step 156 may start with one or more initial silicide formation steps to form silicide layers on exposed source/drain regions to facilitate electrical connection thereto. The initial silicide formation steps may result in separate silicide layers being formed for the source/drain regions of the bottom nanosheet transistors and for the source/drain regions of the top nanosheet transistors. For example, separate silicide layers may be formed on exposed source/drain regions of the bottom and top nanosheet transistors by using any suitable silicidation process to form silicide It will be appreciated that additional processing steps will be used to complete the fabrication of the stacked top and bottom nanosheet transistors into functioning devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

By now it should be appreciated that there has been provided a method for forming a semiconductor device having stacked nanosheet transistors with different gate electrode lengths. In the disclosed method, a stack of alternating semiconductor layers is provided on a substrate, where the stack includes a plurality of first semiconductor layers interspersed in alternating fashion with a plurality of second semiconductor layers. In selected embodiments, the stack of alternating semiconductor layers is provided by epitaxially growing alternating first and second semiconductor layers on the substrate to form a bottom portion of the stack, forming the barrier insulator layer on the bottom portion of the stack, and epitaxially growing alternating first and second semiconductor layers on the barrier insulator layer to form a top portion of the stack. The disclosed fabrication method also selectively etches the stack of alternating semiconductor layers to form a transistor stack on the substrate. In addition, the disclosed fabrication method processes the transistor stack to form a first set of gate electrode structures having a first gate length dimension between a first subset of the plurality of first semiconductor layers and to form a second set of gate electrode structures having a second, shorter gate length dimension between a second subset of the plurality of first semiconductor layers, where the second set of gate electrode structures is formed over the first set of gate electrode structures in the transistor stack. In selected embodiments, each of the plurality of first semiconductor layers is a silicon nanosheet layer, and each of the plurality of second semiconductor layers comprises a silicon germanium nanosheet layer. In other embodiments, the plurality of first semiconductor layers is formed with a first semiconductor material and the plurality of second semiconductor layers is formed with a second semiconductor material having a different isotropic etch rate from the first semiconductor material. In selected embodiments, the processing of the transistor stack to form the first set of gate electrode structures includes forming first remnant second semiconductor layers having the first gate length dimension in at least a bottom portion of the transistor stack. In addition, the transistor stack may be processed to form the second set of gate electrode structures by processing the transistor stack to form second remnant second semiconductor layers having the second gate length dimension in a top portion of the transistor stack. In such embodiments, the processing of the transistor stack may include selectively removing the first and second remnant second semiconductor layers, respectively, from the bottom and top portions of the transistor stack, thereby forming first gate electrode openings in the bottom portion of the transistor stack and second gate electrode openings in the top portion of the transistor stack; and then sequentially depositing a conformal gate dielectric layer and conformal conductive gate layer in the first and second gate electrode openings, thereby forming (a) the first set of gate electrode structures which replace the first remnant second semiconductor layers in the bottom portion of the transistor stack, and (b) the second set of gate electrode structures which replace the second remnant second semiconductor layers in the top portion of the transistor stack.

In another form, there is provided a method for fabricating a semiconductor device which integrates stacked nanosheet transistors with different gate lengths in the same stack in a single nanosheet process flow. In the disclosed fabrication method, a nanosheet stack is provided on a substrate to include a bottom superlattice structure and a top superlattice structure separated from one another by a barrier insulator layer, where each of the bottom and top superlattice structures includes alternating silicon and silicon germanium nanosheet layers. In selected embodiments, the nanosheet stack is provided by epitaxially growing alternating nanosheet layers of silicon and silicon germanium on the substrate to form the bottom superlattice structure, forming the barrier insulator layer on the bottom superlattice structure, forming an epitaxial growth seed layer on the barrier insulator layer, and epitaxially growing alternating nanosheet layers of silicon and silicon germanium on the seed layer to form the top superlattice structure. The disclosed fabrication method also selectively etches the nanosheet stack of alternating silicon and silicon germanium layers to form a nanosheet transistor stack on the substrate. In addition, the disclosed fabrication method processes the nanosheet transistor stack to form first remnant silicon germanium nanosheet layers in at least the bottom superlattice structure having a first gate length dimension. In selected embodiments, the nanosheet transistor stack is processed to form first remnant silicon germanium nanosheet layers by partially recessing silicon germanium nanosheet layers from peripheral sides of the bottom superlattice structure to form recess cavities which define the first remnant silicon germanium nanosheet layers to have the first gate length dimension, and then filling the recess cavities with one or more dielectric layers to form dielectric spacers on peripheral sides of the bottom superlattice structure. In such embodiments, the recess cavities may be filled by depositing a nitride layer on at least the nanosheet transistor stack using a thin film technology comprising chemical vapor deposition, plasma enhanced chemical vapor deposition, molecular beam epitaxy, sputtering, and/or atomic layer deposition, and then etching the nitride layer to form the nitride spacers on peripheral sides of the first remnant silicon germanium nanosheet layers. In addition, the disclosed fabrication method processes the nanosheet transistor stack to form second remnant silicon germanium nanosheet layers in the top superlattice structure having a second gate length dimension that is shorter than the first gate length dimension. In selected embodiments, the nanosheet transistor stack is processed to form second remnant silicon germanium nanosheet layers by partially recessing silicon germanium nanosheet layers from peripheral sides of the top superlattice structure to form recess cavities which define the second remnant silicon germanium nanosheet layers to have the second gate length dimension; and filling the recess cavities with one or more dielectric layers to form dielectric spacers on peripheral sides of the top superlattice structure. In addition, the disclosed fabrication method forms first and second epitaxial source/drain semiconductor regions adjacent, respectively, to the bottom and top superlattice structures, where the first and second epitaxial source/drain semiconductor regions are electrically isolated from one another by an insulating layer. In selected embodiments, the first and second epitaxial source/drain semiconductor regions may be formed by forming first epitaxial source/drain semiconductor regions adjacent to the bottom superlattice structure, forming the insulating layer on a top surface of the first epitaxial source/drain semiconductor regions, and forming second epitaxial source/drain semiconductor regions on top of the insulating layer and adjacent to the top superlattice structure, where the first and second epitaxial source/drain semiconductor regions are electrically isolated from one another by the insulating layer. The disclosed fabrication method also selectively processes the nanosheet transistor stack to simultaneously form (a) bottom gate electrodes which replace the first remnant silicon germanium nanosheet layers in the bottom superlattice structure, thereby forming a bottom nanosheet transistor comprising the bottom gate electrodes having the first gate length dimension, the silicon nanosheet layers from the bottom superlattice structure, and the first epitaxial source/drain semiconductor regions, and (b) top gate electrodes which replace the second remnant silicon germanium nanosheet layers in the top superlattice structure, thereby forming a top nanosheet transistor comprising the top gate electrodes having the second gate length dimension that is shorter than the first gate length dimension, the silicon nanosheet layers from the top superlattice structure, and the second epitaxial source/drain semiconductor regions. In selected embodiments, the selectively processing of the nanosheet transistor stack includes selectively etching the first and second remnant silicon germanium nanosheet layers from the nanosheet transistor stack to respectively form first and second gate etch openings in the bottom and top superlattice structures; conformally depositing one or more dielectric layers in the first and second gate etch openings using a thin film technology; and depositing one or more conductive layers in the first and second gate etch openings to form bottom and top gate electrodes in the bottom and top superlattice structures.

In yet another form, there is provided a semiconductor device and associated method of fabrication. As disclosed, the semiconductor device includes a substrate, a first transistor stack formed on top of the substrate, and a second transistor stack formed on top of the first transistor stack. As formed the first transistor stack includes a first transistor channel region with at least first and second semiconductor layers separated from one another in a vertical dimension extending from the substrate, and a first control electrode stack comprising first gate electrode structures having a first gate length dimension. In addition, the second transistor stack includes a second transistor channel region formed with at least third and fourth semiconductor layers separated from one another in a vertical dimension extending from the substrate, and a second control electrode stack comprising second gate electrode structures having a second, shorter gate length dimension. In selected embodiments, each of the first, second, third, and fourth semiconductor layers is formed with a silicon nanosheet layer. In selected embodiments, the first and second semiconductor layers are doped with a first doping type impurity, and the third and fourth semiconductor layers are doped with a second, opposite doping type impurity. In other embodiments, the first, second, third, and fourth semiconductor layers are doped with the same doping type impurity. In selected embodiments, the semiconductor device includes first epitaxial source/drain semiconductor regions adjacent to the first transistor stack and directly connected to the first transistor channel region. The semiconductor device may also include second epitaxial source/drain semiconductor regions adjacent to the second transistor stack and directly connected to the second transistor channel region. As formed, the first and second epitaxial source/drain semiconductor regions are electrically isolated from one another by an insulating layer. In other embodiments, the first and second control electrodes include ALD metal gate layers formed on ALD oxide layers. The disclosed semiconductor device may also include an isolation barrier layer formed between the first and second transistor stacks to provide electrical insulation between the first and second transistor stacks.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted stacked nanosheet transistor structures may be formed with different processing steps that can be combined and integrated, and can utilize Si/SiGe superlattice structures having different numbers of SiGe and Si layers. Also, the various silicon-based constituent layers may be formed with different conductive materials than those disclosed. In addition, the epitaxial sources and drains may be p-type or n-type, depending on whether forming either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   providing a stack of alternating semiconductor layers on a substrate, the stack comprising a plurality of first semiconductor layers interspersed in alternating fashion with a plurality of second semiconductor layers;
   selectively etching the stack of alternating semiconductor layers to form a transistor stack on the substrate, where the transistor stack comprises a top portion of etched alternating semiconductor layers and a bottom portion of etched alternating semiconductor layers; and
   processing the transistor stack to form a first set of gate electrode structures having a first gate length dimension between a first subset of the plurality of first semiconductor layers and to form a second set of gate electrode structures having a second, shorter gate length dimension between a second subset of the plurality of first semiconductor layers, where the second set of gate electrode structures is formed over the first set of gate electrode structures in the transistor stack, where processing the transistor stack comprises:
   processing the bottom portion of etched alternating semiconductor layers in the transistor stack to form first remnant second semiconductor layers having the first gate length dimension; and then subsequently
   processing the top portion of etched alternating semiconductor layers in the transistor stack to form second remnant second semiconductor layers having the second, shorter gate length dimension; and then
   forming planarized epitaxial semiconductor regions adjacent to the bottom and top portions of the etched alternating semiconductor layers; and then
   partially etching the planarized epitaxial semiconductor regions to form first epitaxial source/drain semiconductor regions adjacent to the bottom portion of the etched alternating semiconductor layers which expose the top portion of the etched alternating semiconductor layers; and then
   forming a directional oxide layer to cover the first epitaxial source/drain semiconductor regions; and then
   forming second epitaxial semiconductor regions adjacent to the top portion of the etched alternating semiconductor layers.

2. The method of claim 1, where each of the plurality of first semiconductor layers comprises a silicon nanosheet layer, and where each of the plurality of second semiconductor layers comprises a silicon germanium nanosheet layer.

3. The method of claim 1, where the plurality of first semiconductor layers is formed with a first semiconductor material and where the plurality of second semiconductor layers is formed with a second semiconductor material having a different isotropic etch rate from the first semiconductor material.

4. The method of claim 1, where processing the transistor stack comprises:
   selectively removing the first remnant second semiconductor layers and second remnant second semiconductor layers, respectively, from the bottom and top portions of the transistor stack, thereby forming first gate electrode openings in the bottom portion of the transistor stack and second gate electrode openings in the top portion of the transistor stack; and
   sequentially depositing a conformal gate dielectric layer and conformal conductive gate layer in the first and second gate electrode openings, thereby forming (a) the first set of gate electrode structures which replace the first remnant second semiconductor layers in the bottom portion of the transistor stack, and (b) the second set of gate electrode structures which replace the second remnant second semiconductor layers in the top portion of the transistor stack.

5. The method of claim 1, where providing the stack of alternating semiconductor layers on a substrate comprises:
   epitaxially growing alternating first and second semiconductor layers on the substrate to form a bottom portion of the stack;
   forming a barrier insulator layer on the bottom portion of the stack; and
   epitaxially growing alternating first and second semiconductor layers on the barrier insulator layer to form a top portion of the stack.

6. A method for forming a semiconductor device comprising:
   providing a nanosheet stack on a substrate comprising a bottom superlattice structure and a top superlattice structure separated from one another by a barrier insulator layer, where each of the bottom and top superlattice structures comprises alternating silicon and silicon germanium nanosheet layers;
   selectively etching the nanosheet stack to form a nanosheet transistor stack on the substrate;
   processing the nanosheet transistor stack to form first remnant silicon germanium nanosheet layers in at least the bottom superlattice structure having a first gate length dimension; and then subsequently
   processing the nanosheet transistor stack to form second remnant silicon germanium nanosheet layers in the top superlattice structure having a second gate length dimension that is shorter than the first gate length dimension;
   forming planarized epitaxial semiconductor regions adjacent to the bottom superlattice structure and a top superlattice structure;
   partially etching the planarized epitaxial semiconductor regions to form first epitaxial source/drain semiconductor regions adjacent to the bottom superlattice structure which expose the top superlattice structure;
   forming a directional insulator layer to cover the first epitaxial source/drain semiconductor regions;
   forming second epitaxial semiconductor regions adjacent to the top superlattice structure, where the first and second epitaxial source/drain semiconductor regions are electrically isolated from one another by an insulating directional insulator layer; and selectively processing the nanosheet transistor stack to simultaneously form (a) bottom gate electrodes which replace the first remnant silicon germanium nanosheet layers in the bottom superlattice structure, thereby forming a bottom nanosheet transistor comprising the bottom gate electrodes having the first gate length dimension, the silicon nanosheet layers from the bottom superlattice structure, and the first epitaxial source/drain semiconductor regions, and (b) top gate electrodes which replace the second remnant silicon germanium nanosheet layers in the top superlattice structure, thereby forming a top nanosheet transistor comprising the top gate electrodes having the second gate length dimension that is shorter than the first gate length dimension, the silicon nanosheet layers from the top superlattice structure, and the second epitaxial source/drain semiconductor regions.

7. The method of claim 6, where providing the nanosheet stack comprises:

epitaxially growing alternating nanosheet layers of silicon and silicon germanium on the substrate to form the bottom superlattice structure;

forming the barrier insulator layer on the bottom superlattice structure;

forming an epitaxial growth seed layer on the barrier insulator layer; and epitaxially growing alternating nanosheet layers of silicon and silicon germanium on the seed layer to form the top superlattice structure.

8. The method of claim 6, where processing the nanosheet transistor stack to form first remnant silicon germanium nanosheet layers comprises:

partially recessing silicon germanium nanosheet layers from peripheral sides of the bottom superlattice structure to form recess cavities which define the first remnant silicon germanium nanosheet layers to have the first gate length dimension; and filling the recess cavities with one or more dielectric layers to form dielectric spacers on peripheral sides of the bottom superlattice structure.

9. The method of claim 8, where filling the recess cavities comprises:

depositing a nitride layer on at least the nanosheet transistor stack using a thin film technology; and etching the nitride layer to form the nitride spacers on peripheral sides of the first remnant silicon germanium nanosheet layers.

10. The method of claim 6, where processing the nanosheet transistor stack to form second remnant silicon germanium nanosheet layers comprises:

partially recessing silicon germanium nanosheet layers from peripheral sides of the top superlattice structure to form recess cavities which define the second remnant silicon germanium nanosheet layers to have the second gate length dimension; and filling the recess cavities with one or more dielectric layers to form dielectric spacers on peripheral sides of the top superlattice structure.

11. The method of claim 6, where selectively processing the nanosheet transistor stack comprises:

selectively etching the first and second remnant silicon germanium nanosheet layers from the nanosheet transistor stack to respectively form first and second gate etch openings in the bottom and top superlattice structures;

conformally depositing one or more dielectric layers in the first and second gate etch openings using a thin film technology; and conformally depositing one or more conductive layers in the first and second gate etch openings to form bottom and top gate electrodes in the bottom and top superlattice structures.

12. The method of claim 11, further comprising forming an organic oxide layer over the substrate to protect the first gate electrodes in the bottom superlattice structure while leaving exposed the first gate electrodes in the top superlattice structure.

* * * * *